United States Patent
Cue et al.

(10) Patent No.: US 11,849,004 B2
(45) Date of Patent: *Dec. 19, 2023

(54) ACTIVATION OF DYNAMIC FILTER GENERATION FOR MESSAGE MANAGEMENT SYSTEMS THROUGH GESTURE-BASED INPUT

(71) Applicant: Dropbox, Inc., San Francisco, CA (US)

(72) Inventors: Adam Cue, San Francisco, CA (US); George Milton Underwood, IV, Palo Alto, CA (US); Tim Van Damme, San Francisco, CA (US)

(73) Assignee: Dropbox, Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/819,752

(22) Filed: Aug. 15, 2022

(65) Prior Publication Data
US 2022/0392775 A1 Dec. 8, 2022

Related U.S. Application Data

(63) Continuation of application No. 15/396,317, filed on Dec. 30, 2016, now Pat. No. 11,444,899, which is a
(Continued)

(51) Int. Cl.
*H04L 67/567* (2022.01)
*G06F 3/0488* (2022.01)
(Continued)

(52) U.S. Cl.
CPC .......... *H04L 67/567* (2022.05); *G06F 3/0482* (2013.01); *G06F 3/0488* (2013.01); *G06Q 10/107* (2013.01)

(58) Field of Classification Search
CPC ... G06F 3/0482; G06F 3/0488; G06Q 10/107; H01L 2224/73265; H04L 67/567
See application file for complete search history.

(56) References Cited

U.S. PATENT DOCUMENTS

| 5,917,489 A | 6/1999 | Thurlow et al. |
| 7,469,280 B2 | 12/2008 | Simpson et al. |

(Continued)

FOREIGN PATENT DOCUMENTS

| EP | 2397937 A1 | 12/2011 |
| JP | 2002529821 A | 9/2002 |

(Continued)

OTHER PUBLICATIONS

Communication Pursuant to Article 94(3) EPC for European Application No. 20168717.5 dated Mar. 11, 2022, 12 pages.
(Continued)

*Primary Examiner* — Thomas J Dailey
(74) *Attorney, Agent, or Firm* — DLA PIPER LLP (US)

(57) ABSTRACT

Generation of filtering rules for incoming messages can be activated by a user through a gesture-based input. When the user activates filtering rule generation, the message management service can cause a user device to display a prompt requesting additional data to be used to generate the filtering rule. The gesture can be a swipe and hold gesture, where the swipe is associated with an action (archiving, deleting, deferring, or adding the message to a list), and the swipe and hold action can activate filtering rule generation associated with the action.

20 Claims, 19 Drawing Sheets

Related U.S. Application Data continuation of application No. 14/569,456, filed on Dec. 12, 2014, now Pat. No. 9,537,805, which is a continuation-in-part of application No. 14/228,181, filed on Mar. 27, 2014, now Pat. No. 9,197,590.

(60) Provisional application No. 62/012,952, filed on Jun. 16, 2014.

(51) Int. Cl.
*G06Q 10/107* (2023.01)
*G06F 3/0482* (2013.01)

(56) References Cited

U.S. PATENT DOCUMENTS

| | | | |
|---|---|---|---|
| 7,693,945 | B1 | 4/2010 | Dulitz et al. |
| 8,090,787 | B2 | 1/2012 | Polis et al. |
| 8,400,417 | B2 | 3/2013 | Ording et al. |
| 8,423,577 | B1 | 4/2013 | Lee et al. |
| 8,554,847 | B2 | 10/2013 | Shue |
| 8,564,544 | B2 | 10/2013 | Jobs et al. |
| 8,635,561 | B1 | 1/2014 | Bullock et al. |
| 2003/0187937 | A1 | 10/2003 | Yao et al. |
| 2004/0088359 | A1 | 5/2004 | Simpson et al. |
| 2005/0204001 | A1 | 9/2005 | Stein et al. |
| 2007/0143433 | A1 | 6/2007 | Daigle et al. |
| 2007/0177803 | A1 | 8/2007 | Elias et al. |
| 2007/0260643 | A1 | 11/2007 | Borden et al. |
| 2008/0165145 | A1 | 7/2008 | Herz et al. |
| 2009/0013052 | A1 | 1/2009 | Robarts et al. |
| 2009/0037469 | A1 | 2/2009 | Kirsch et al. |
| 2009/0153288 | A1 | 6/2009 | Hope et al. |
| 2009/0234780 | A1 | 9/2009 | Drucker et al. |
| 2009/0300124 | A1 | 12/2009 | Anguenot |
| 2009/0319456 | A1 | 12/2009 | Consul et al. |
| 2010/0031202 | A1 | 2/2010 | Morris et al. |
| 2010/0199226 | A1 | 8/2010 | Nurmi et al. |
| 2010/0205259 | A1 | 8/2010 | Mtaldevara et al. |
| 2010/0214237 | A1 | 8/2010 | Echeverri et al. |
| 2010/0241973 | A1 | 9/2010 | Whiddett et al. |
| 2011/0258280 | A1 | 10/2011 | Sloan et al. |
| 2011/0314427 | A1 | 12/2011 | Sundararajan |
| 2012/0240054 | A1 | 9/2012 | Webber et al. |
| 2012/0254228 | A1 | 10/2012 | Patoskie et al. |
| 2012/0290662 | A1 | 11/2012 | Weber et al. |
| 2012/0290946 | A1 | 11/2012 | Schrock et al. |
| 2013/0104089 | A1 | 4/2013 | Rieffel et al. |
| 2014/0035826 | A1 | 2/2014 | Frazier et al. |
| 2014/0040768 | A1 | 2/2014 | Lazaridis et al. |
| 2014/0143738 | A1 | 5/2014 | Underwood, IV et al. |
| 2014/0207877 | A1 | 7/2014 | Kandaswamy et al. |
| 2015/0281155 | A1 | 10/2015 | Cue et al. |
| 2015/0281156 | A1 | 10/2015 | Beausoleil et al. |
| 2016/0065517 | A1 | 3/2016 | Beausoleil et al. |
| 2017/0302603 | A1 | 10/2017 | Cue et al. |

FOREIGN PATENT DOCUMENTS

| | | |
|---|---|---|
| JP | 2003218945 A | 7/2003 |
| JP | 2005128705 A | 5/2005 |
| JP | 2012146160 A | 8/2012 |
| JP | 2013544410 A | 12/2013 |
| WO | 2014030667 A1 | 2/2014 |
| WO | 2015147926 A1 | 10/2015 |
| WO | 2015149025 A1 | 10/2015 |

OTHER PUBLICATIONS

Communication pursuant to Rule 115(1) EPC for European Application No. 14827955.7, dated Oct. 15, 2019, 7 pages.
Result of Consultation for European Application No. 15717332.9 dated Jun. 16, 2021, 6 pages.
Extended European Search Report for European Application No. 20168717.5 dated Jul. 16, 2020, 10 pages.
Google, Weekly Askey Circulation No. 932, with a schedule and schedule, May 28, 2013,14 pages.
"How to Flag, Forward, Move and Delete Emails in iOS7," Jul. 15, 2013, retrieved http://www.losguides.net/flag-forward-move-delete-emails-ios-7/; on Jul. 18, 2019, 4 Pages.
International Search Report and Written Opinion for PCT Application No. PCT/US14/71470 dated Jul. 30, 2015, 12 pages.
International Search Report and Written Opinion for PCT Application No. PCT/US2015/023180 dated Jul. 7, 2015, 10 pages.
Non-Final Office Action for U.S. Appl. No. 14/228,181 dated Sep. 24, 2014, 11 pages.
Non-Final Office Action from U.S. Appl. No. 15/396,317, dated Dec. 8, 2021, 16 pages.
Notice of Allowance from U.S. Appl. No. 15/396,317, dated Jun. 8, 2022, 9 pages.
Notice of Allowance from U.S. Appl. No. 15/867,635, dated Dec. 4, 2019, 8 pages.
Notice of Allowance for U.S. Appl. No. 14/228,181 dated Jul. 24, 2015, 7 pages.
Notification of Reason for Refusal for Japanese Application No. 20190110505 dated Sep. 25, 2020, 8 pages.
Office Action for U.S. Application No. 14/228, 181 dated Apr. 20, 2015, 16 pages.
Office Action for U.S. Appl. No. 14/569,456 dated Jul. 10, 2015, 11 pages.
Rennie J.D.M., "ifile: An Application of Machine Learning to E-Mail Filtering," KDD-2000 Text Messaging Workshop, Boston, MA, 2000, 6 pages.
Summons to Attend Oral Proceedings Pursuant to Rule 115(1) EPC for European Application No. 15717332.9 dated Dec. 17, 2020, 8 pages.
Supplementary European Search Report for EP Application No. 14827955.7 dated Aug. 2, 2017, 3 pages.
Weekly ASCII JP, "Mail, Schedule and Map are Both Google," vol. 932, May 28, 2013,6 pages.

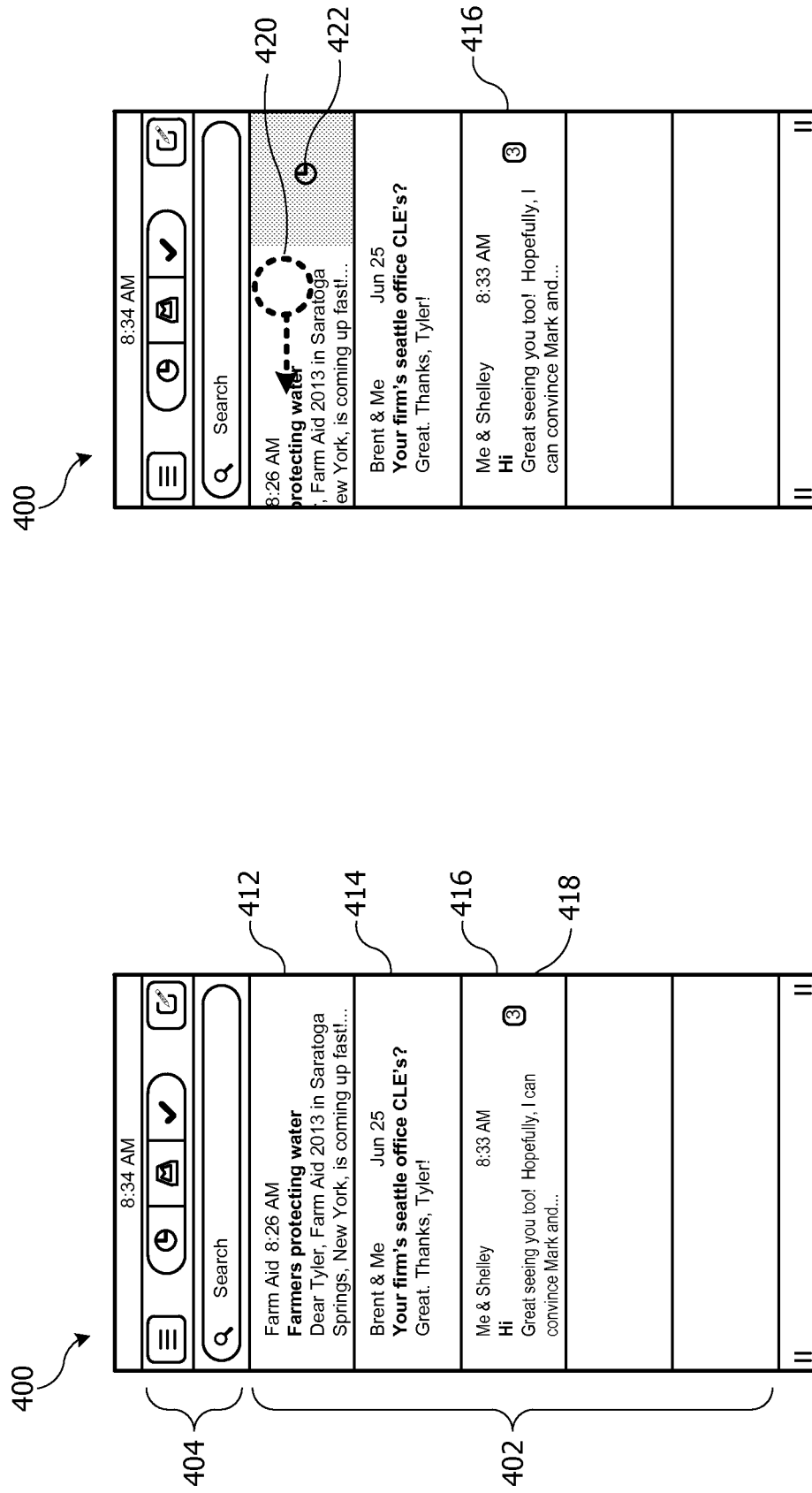

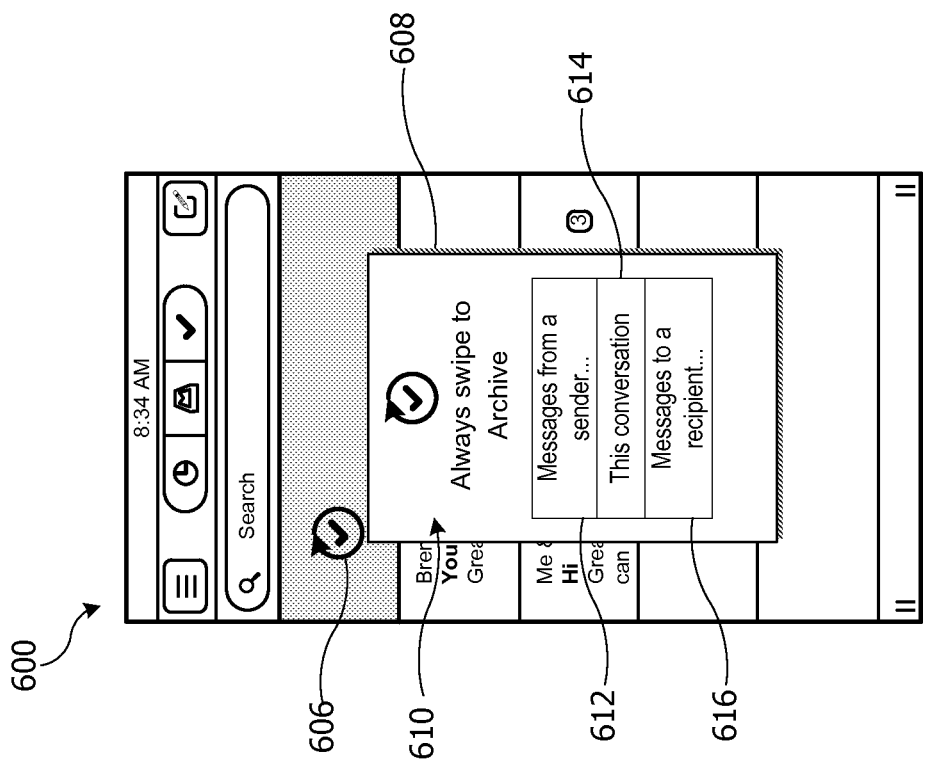
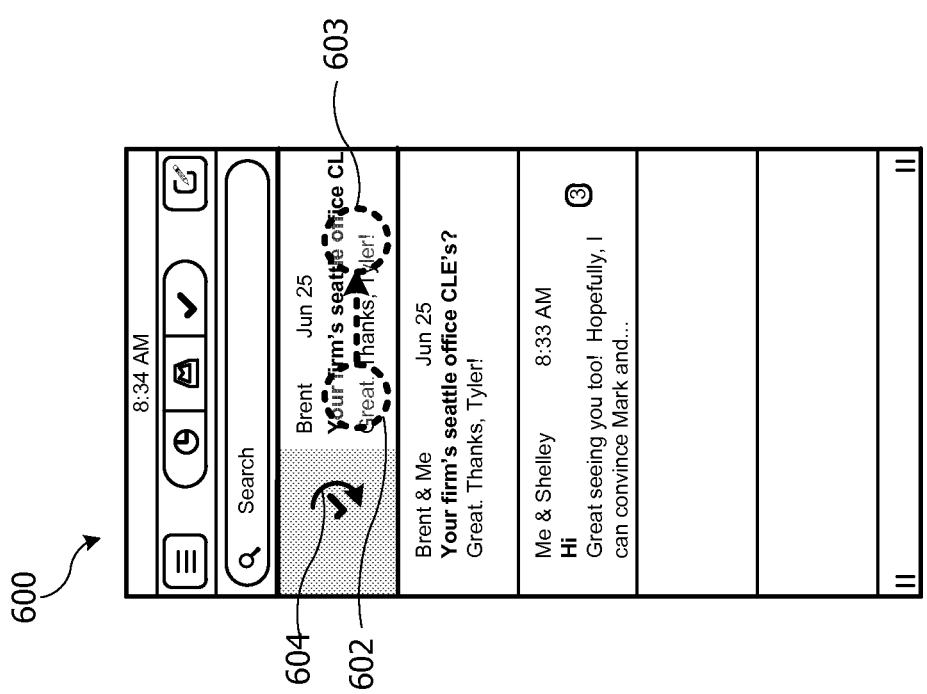
FIG. 6B
FIG. 6A

ACTIVATION OF DYNAMIC FILTER GENERATION FOR MESSAGE MANAGEMENT SYSTEMS THROUGH GESTURE-BASED INPUT

CROSS-REFERENCE TO RELATED APPLICATIONS

This is a continuation of U.S. application Ser. No. 15/396,317, filed Dec. 30, 2016, which is a continuation of U.S. application Ser. No. 14/569,456, filed Dec. 12, 2014, now U.S. Pat. No. 9,537,805, issued Jan. 3, 2017, which claims priority to U.S. Provisional Application Ser. No. 62/012,952, filed Jun. 16, 2014, which are incorporated by reference in their entireties.

U.S. application Ser. No. 14/569,456 claims priority to, and is a continuation-in-part of, U.S. application Ser. No. 14/228,181, filed Mar. 27, 2014, now U.S. Pat. No. 9,197,590, issued Nov. 24, 2015, which are incorporated by reference in their entireties.

BACKGROUND

The present disclosure relates generally to management of electronic messages and in particular to dynamically generating filters in a message management service based on user actions.

Individuals are becoming increasingly reliant on electronic messaging services, such as email services, instant messaging services, SMS/MMS (also referred to as text-messaging) services, and so on. Such services allow users to send and receive messages. In some instances, the services may also provide additional features related to managing messages, such as the ability to store or archive messages in folders, delete messages, search stored messages, and so on.

Many users who rely on electronic messaging services use various electronic devices, such as laptop or desktop computers, smart phones, tablets, and so on, that are capable of connecting to various data networks and acting as clients of an electronic messaging service. For example, a client can receive messages from a messaging service and can provide a user interface that allows the user to interact with messages, e.g., by replying to messages, deleting messages, archiving messages, composing new messages to be sent, etc. When connected to a data network, the client device can communicate updates from the messaging service to the user and can communicate instructions to the messaging service to implement user actions. With the growing popularity of mobile devices, users can access their messages almost anytime and almost anywhere. This convenience can lead to a large volume of messages being sent and received.

Unfortunately, many users of messaging services now find themselves overwhelmed by the volume of messages they receive. Techniques that allow users to better manage their messages are therefore desirable.

SUMMARY

Certain embodiments of the present invention relate to dynamic generation of filtering rules that can be applied to automatically filter incoming messages for a user. The rules can be generated by the user through gesture-based inputs. For example, using a client device, a user can take actions on received messages, such as moving a message to a particular folder or list, deferring a message for later review and action (e.g., at a specified time), deleting a message without reading it, and so on. Each action can be initiated by the user through a gesture. For example, a swipe in a given direction over a particular distance can correspond to one action, while swipe in the same direction over a different distance can correspond to another action. Gestures can include multiple portions or sub-gestures which can cause different but related actions to be performed. For example, a swipe and hold gesture includes both a swipe portion and a hold portion. This provides an intuitive way for users to define rules without adding substantial complexity to the user interface. For example, if the user performs a swipe and hold gesture on a message, where the swipe portion corresponds to a defer action, the hold portion can cause a rule selection interface to be displayed. Once the user has provided the requested information, the message management service can establish the requested rule as a processing rule to be automatically applied to future messages addressed to the user.

Certain embodiments relate to methods for defining rules. A client device can detect a gesture input corresponding to an action to be performed on at least one message for a user. The client device can analyze the gesture input to identify the action to be performed and display, based on the analysis, a list of selectable options related to the action. The client device can receive a selection of data associated with the at least one message and send the selection of data associated with the at least one message from the client device to a message management service, to define a rule based on the selection of data and the action.

Certain embodiments relate to message management services and systems. One example of a message management system can include a client interface configured to communicate with a client device operable by a user, a messaging service interface configured to receive messages for the user from two or more messaging services. The messages can be processed by various message management modules, including a filter module, an event recorder, and a pattern detector. The message management service can also include a rule manager that receives requests to generate rules from client devices and adds those rules to the filter module. Subsequent messages can then be processed according to the user defined rules.

Certain embodiments relate to methods for performing compound-gesture based actions on content items. A client device can receive a selection of a content item using a gesture. The gesture can be a compound gesture including, e.g., a swipe portion and a hold portion. The gesture can be analyzed to determine actions to be performed on the selected content item. For example, where the gesture includes a hold portion, a time period associated with the hold portion can be determined. The time period can be compared to a threshold value and, if the time period is less than the threshold value a first action can be performed and if the time period is greater than the threshold value a second action can be performed.

The following detailed description together with the accompanying drawings will provide a better understanding of the nature and advantages of the present invention.

BRIEF DESCRIPTION OF THE DRAWINGS

FIGS. 4A-4C show user interface screens for a client device according to an embodiment of the present invention.

FIGS. 6A-6B show user interface screens for a client device according to an embodiment of the present invention.

DETAILED DESCRIPTION

Certain embodiments of the present invention relate to dynamic generation of filtering rules that can be applied to automatically filter incoming messages for a user. The rules can be automatically generated based on patterns in the user's behavior. For example, using a client device, a user can take actions on received messages, such as moving a message to a particular folder or list, deferring a message for later review and action (e.g., at a specified time), deleting a message without reading it, and so on. The client device can report these actions, as event information, to a message management service that acts as an intermediary between the client device and one or more messaging services. The message management service can create event records associating the event information with message features of the message that was acted on. By analyzing event records related to a number of messages, the message management service can detect a correlation between a "triggering" condition (which can be based on one or more message features) and a resulting user action. If the user has multiple messaging accounts linked to the message management service, the correlations can be detected across accounts. Where a sufficiently strong correlation is detected, the message management service can generated a suggested rule to automatically take the action on future messages satisfying the triggering condition. The message management service can provide the suggested rule to the user's client device. The client can present the suggested rule to the user, who can accept or decline the suggestion. If the suggestion is accepted, the message management service can establish the suggested rule as a processing rule to be automatically applied to future messages addressed to the user.

Figure 1:
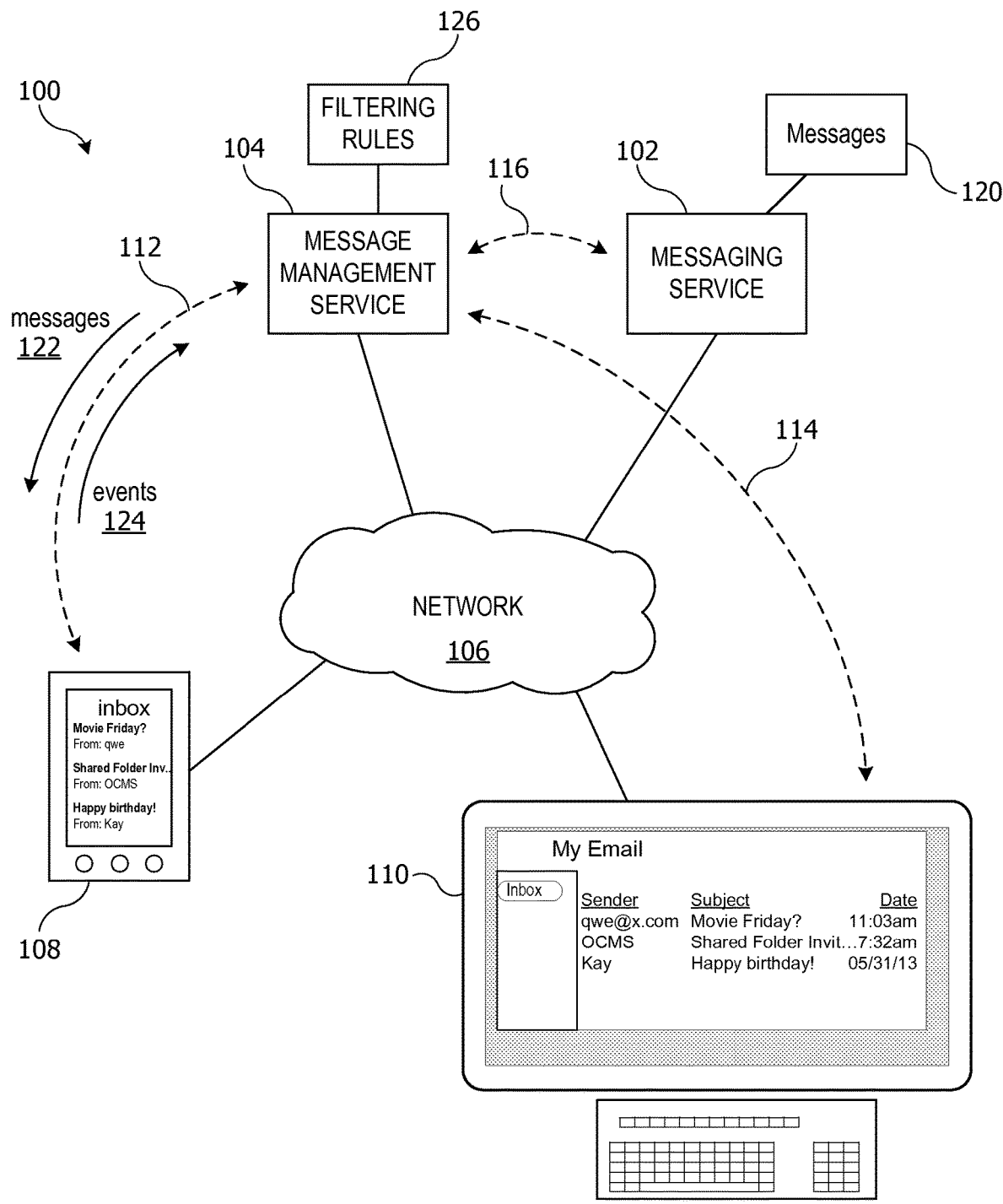
FIG. 1 shows a block diagram of a communication system according to an embodiment of the present invention.

FIG. 1 shows a block diagram of a communication system 100 according to an embodiment of the present invention. Communication system 100 can include a messaging service 102 and a message management service 104 connected to a network 106. Also connected to network 106 can be various clients 108, 110 that can be used to access messaging service 102 via message management service 104, as indicated by dashed arrows 112, 114. It is to be understood that access to message management service 104 and/or messaging service 102 can be indirect, e.g., via network 106.

Messaging service 102 can be any service that allows users to send, receive, store, and/or access messages, where a "message" can include any electronic communication generated by a sender and directed to one or more recipients, such as email messages, instant messages (e.g., messages sent between users using various "chat" services), SMS/MMS messages (e.g., messages conforming to Short Messaging Service and/or Multimedia Messaging Service protocols supported by various cellular and other wireless data networks), voice messages, photo/image messages, social network messages, and so on. Examples of messaging service 102 can include email services such as Gmail™ (a service of Google Inc.) and Yahoo! ® Mail (a service of Yahoo! Inc.). Other examples can include instant messaging or chat services such as Gmail's chat feature or the Facebook® chat function (a service of Facebook, Inc.), SMS/MMS services provided by cellular data carriers, social network services with a messaging component (e.g., social networks provided by Facebook, Inc., or LinkedIn Corp.), and so on. In some embodiments, a user can establish an account with messaging service 102, and messaging service 102 can store and provide access to the user's messages 120. Messaging service 102 can also provide web-based client interfaces, dedicated application programs, application program interfaces (APIs), and/or other tools for facilitating user access to messages 120.

Message management service 104 can be a service that acts as a proxy or intermediary between messaging service 102 and clients 108, 110, as indicated by dashed arrow 116. Message management service 104 can provide enhanced functionality for organizing, storing, accessing, composing, and/or responding to messages 120 stored by messaging service 102. One example of message management service 104 can be the Mailbox service of Dropbox, Inc.

Clients 108 and 110 can be user-operated computing devices that can execute software to interact with message management service 104. Various types of computing devices can be used, including desktop computers, laptop computers, tablet computers, smart phones, wearable computing devices, personal digital assistants, and so on. By way of example, client 108 can be a smart phone that can execute an application program (also referred to as an app) to communicate with message management service 104 via network 106. The app can be provided by a provider of message management service 104 and can be customized to allow access to enhanced message management functions supported by message management service 104.

Client 110 can be a desktop computer that can execute an app to communicate with message management service 104. This app can be, for example, a mail client app built into an operating system of a desktop computer, a web browser that interfaces with a web-based messaging service, a service-specific application provided by the provider of message management service 104, or another app. It is to be understood that in some embodiments, clients 108 and 110 can execute other apps to communicate with messaging service 102 without using message management service 104.

A given user can have accounts with both messaging service 102 and message management service 104. The user's account with message management service 104 can be linked to the user's account with messaging service 102, allowing the user to use message management service 104 to manage messages 120 sent and received via messaging service 102. In some embodiments, a user can have multiple accounts with one or more messaging services 102 and can link any or all of these accounts to a single account with message management service 104. Message management service 104 can retrieve a subset of messages for the user from messaging service 102 and deliver these messages to client 108 and/or client 110.

As shown in FIG. 1, messages 122 (which can include a subset of messages 120) can be delivered to client 108 (or client 110) as new incoming messages for the user. A user can interact with client 108 to act on messages 122. For instance, client 108 can present a list of new messages (sometimes referred to as an inbox) that includes information about each message, such as the sender, date, subject, preview portion of the message content, and so on. The user can select a message to open, in which case client 108 can present the full content of the message to the user. After reading the message, the user can take action, such as moving the message to a folder or list, archiving the message, deleting the message, deferring the message for later review or action, replying to or forwarding the message, and so on. In some embodiments, the user can also act on a message directly from the message list, without first opening the message. When the user acts on a message, client 108 can send event information 124 to message management service 104, indicating the action taken on a particular message. Message management service 104 can update its internal state accordingly and/or send appropriate updates to messaging service 102.

In accordance with certain embodiments of the present invention, message management service 104 can apply filtering rules 126 to messages. Each filtering rule 126 (also referred to herein simply as a "rule") can identify an action that should automatically be taken for messages satisfying a "triggering" condition. A triggering condition can be based on any message feature or combination of message features, such as a subject line, a sender, message content, when the message was sent or received (e.g., time of day, day of the week), message format (e.g., plain text versus HTML), message length, whether the message has any attachments, and so on. The action can include any action a user might perform with regard to a message, such as moving the message to a specific list or folder, deleting or archiving the message, deferring the message for later action, replying to the message, forwarding the message, and so on. In some instances, applying filtering rules 126 may result in a message being held for later delivery to client 108 or not being delivered to client 108 at all, depending on the particular rule. Specific examples of rules are described below.

In some embodiments, filtering rules 126 can include rules that are dynamically generated by message management service 104 based on patterns of user actions taken on received messages. For example, message management service 104 can store a collection of event records, where each record includes information about message features (content and/or metadata of a particular message) and the user action taken in regard to the message. Message management service 104 can analyze event records collected for a particular user to detect patterns of behavior. For example, a user may consistently defer messages from a particular sender or sent to a particular group of recipients until the evening or the weekend. Or a user may consistently archive or delete messages with certain words in the subject line or messages from a particular sender without first reading them. A pattern can be detected, e.g., as a correlation between features of the message and a specific user action. Once a pattern is detected, message management service 104 can generate a suggested filtering rule. This filtering rule can be suggested to the user, for instance by sending the suggested rule to client 108 along with a message 122 to which the rule would be applied. Client 108 can present the suggested rule to the user, who can accept or decline it. If the user accepts the suggested rule, message management service 104 can establish the rule, e.g., by adding it to a set of filtering rules 126. Specific examples of dynamic generation and suggestion of filtering rules are described below.

It will be appreciated that system 100 is illustrative and that variations and modifications are possible. Embodiments of the present invention can support any number of client devices, including client devices belonging to or otherwise associated with different users. Further, in some embodiments, a message management service can interact with multiple messaging services and can manage messages of disparate types (e.g., email and social network messages). As described below, where the message management service interacts with multiple messaging services, the message management service can dynamically generate and suggest filtering rules with or without regard to which messaging service was the origin of a particular message.

Figure 2:
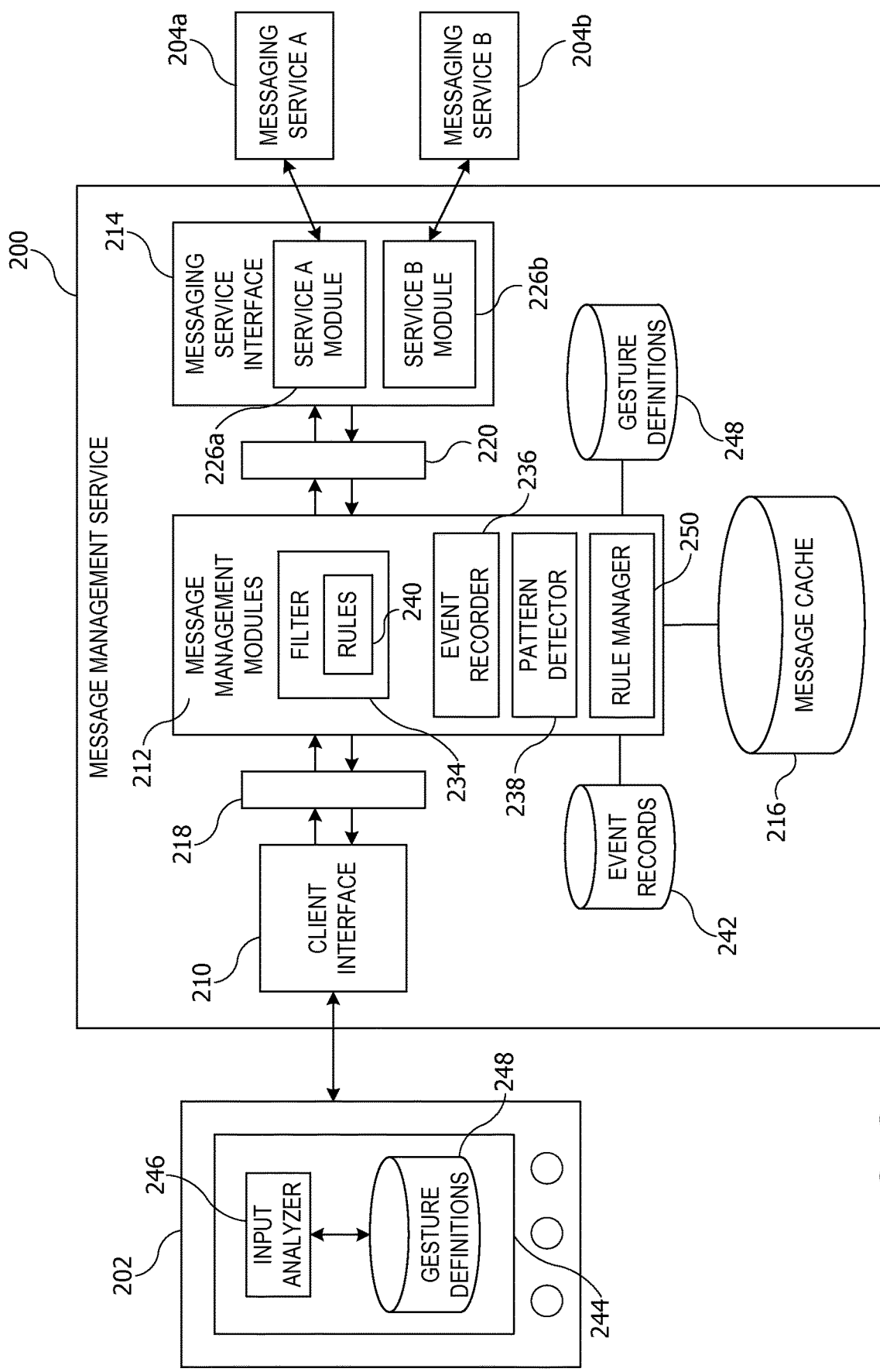
FIG. 2 shows a block diagram of a message management service according to an embodiment of the present invention.

FIG. 2 shows a block diagram of a message management service 200 according to an embodiment of the present invention. Message management service 200 can implement message management service 104 of FIG. 1. For example, message management service 200 can act as an intermediary between a client 202 (e.g., implementing client 108 or client 110 of FIG. 1) and various messaging services 204a, 204b (e.g., implementing messaging service 102) of FIG. 1. Each service 204a, 204b can be a different messaging service, such as different email services, an email service and a social network service, and so on. While two messaging services 204 are shown, any number of messaging services 204 can be supported by a single message management service 200.

Message management service 200 can include a client interface 210, message management modules 212, a messaging service interface 214, and a message cache 216. A client transfer layer 218 can provide transfer queues for transferring messages and other instructions and information between client interface 202 and message management modules 212, and a service transfer layer 220 can provide transfer queues for transferring messages and other instructions and information between message management modules 212 and messaging service interface 214.

Client interface 210 can communicate with multiple instances of client 202 (e.g., clients associated with different users and/or multiple clients associated with the same user). For instance, client interface 210 can deliver "inbound" messages from messaging services 204a, 204b to client 202, receive "outbound" messages from client 202, and/or receive various message processing instructions from client 202, such as instructions to defer a message, move a message to a list or folder, mark a message as read (or unread), delete a message, and so on. Such instructions can include event information or user actions as described herein.

Message management modules 212 can include functional blocks or modules configured to perform various operations on messages received by message management service 200, including outbound messages received from client 202 as well as inbound messages received from messaging services 204a, 204b. For example, message management modules 212 can include filter module 234, event recorder 236, and pattern detector 238.

Filter module 234 can apply filtering rules (e.g., implementing filtering rules 126 of FIG. 1) to inbound messages prior to delivery to the client. In some embodiments, filter module 234 can maintain a data store of established rules 240, where each rule specifies a "triggering" condition and a resulting action. The triggering condition can be specified, for instance, based on a feature or combination of features of the inbound message. Examples include: the presence of specific words in a subject line of the message; the message being from a particular sender; which messaging service 204a, 204b received the message; the message being addressed to a particular set of recipients; time of receipt (e.g., date, time of day, day of week) being in a particular time frame; message size being above or below some threshold; message content including particular words or combinations of words; and so on. Any feature of a message that is detectable by filter module 234 can be used to define a triggering condition, either individually or in combination with other message features. A resulting action specified by a rule can include any action a user might take with regard to a received message. Examples include: moving the message to a list or folder; archiving the message; deleting the message; deferring the message for later action; replying to the message; forwarding the message to a particular destination (e.g., another user); and so on. In some embodiments, established filtering rules 240 are applied to every new message received for a particular user from any of messaging services 204a, 204b. Different sets of filtering rules 240 can be established for different users, providing a customized user experience.

Event recorder 236 can gather information about user actions responsive to messages, in a format that facilitates dynamic generation of filtering rules 240. For example, when a user acts on a received message, client 202 can report the action to client interface 210. Event recorder 236 can generate an event record based on the reported action. As used herein, an event record can be any type of structured data record that includes information about features (or characteristics) of the message and the user action. In some embodiments, the information about the user action can include the action taken (e.g., move, archive, defer, reply, etc.), whether the user read the message before taking the action, and client context information relating to the action, such as the identity of client 202 (e.g., mobile phone, desktop computer), the location of client 202 when the action was taken, time at which the action was taken, and so on. In some embodiments, event recorder 236 can store event records in event records data store 242. Event records data store 242 can include records for any number of messages and corresponding user actions and can be subject to periodic purging, e.g., based on an upper limit on number of event records stored and/or age of event records stored.

Pattern detector 238 can analyze records in event records data store 242 to detect patterns, such as a correlation between a particular set of message features and a resulting user action. Any type of pattern detection logic can be implemented. In one example, pattern detector 238 can simply count the number of consecutive times a message satisfying a particular condition resulted in the same user action. For instance, if the user deletes five messages in a row from a particular sender without reading them, this may indicate that the user is not interested in receiving messages from that sender. Pattern detector 238 can detect the behavior and suggest a rule to automatically delete messages from that sender. (Suggestion of rules is described below.) As another example, if the user defers three messages having a particular subject line until Friday, this may indicate that the user wants to defer all such messages until Friday. Pattern detector 238 can detect this behavior and suggest a rule to automatically defer messages having that subject line.

In some embodiments, pattern detector 238 can also detect more complex or subtle patterns that consistently trigger the same user action. For example, a pattern might be based on a combination of subject line and sender, sender and recipient list, sender and time of day or day of week, sender and message content, message content and time of day or day of week, and so on. In some embodiments, pattern detector 238 can implement machine-learning algorithms (e.g., artificial neural networks or the like) that can detect correlations between some set of message features and a resulting user action. Further examples of pattern detection are described below.

In some embodiments, client context information (e.g., as described above) can be combined with message features in the pattern-detection analysis. Thus, it can be possible to detect, for instance, that a user has a pattern of deferring messages from a particular sender (or group of senders) until she is at home or at her desktop computer.

When pattern detector 238 detects a pattern, it can generate a suggested rule and provide the suggested rule to filter module 234. In some embodiments, filter module 234 does not automatically implement suggested rules received from pattern detector 238. Instead, filter module 234 can first obtain user confirmation. For example, upon receiving a suggested rule form pattern detector 236, filter module 234 can store the suggested rule separately from established rules 240. If an inbound message is received to which the suggested rule would apply, filter module 234 can add suggestion metadata defining the suggested rule to the inbound message and send it on to client interface 210 for delivery to client 202. Client 202 can extract the metadata, present the suggested rule to the user, obtain a response from the user, and report the response to message management service 200. If the user accepts the suggested rule, filter module 234 can add the suggested rule to established rules 240. Examples are described below.

In some embodiments, client device 202 can include a user input device 244 such as a touchscreen, camera, or other device that is operable to receive user input. User input can be provided as gestures through interaction with user input device 244. For example, a user can make contact with a touchscreen (e.g., using a finger, stylus, or other implement) and move that contact point to another position on the touchscreen. Such gestures, also referred to as "swipes", may be received by user input device 244 and analyzed by input analyzer 246 to identify one or more actions associated with the gesture. In some embodiments, swipes may be characterized by a vector that corresponds to the direction of the gesture across user input device 244 and the length traversed by the gesture. Different actions may be associated with different directions and/or with the length of the user's swipe. For example, a swipe to the right that traverses a first distance of the screen of the user device may correspond to an archive action, whereas a swipe that traverses a second distance can correspond to a delete action. Input analyzer 246 can detect the initial contact with user input device 244 and identify a length and direction associated with the gesture. Based on the length and direction of the gesture, input analyzer 246 can look up one or more actions to be performed using gesture definitions 248. In some embodiments, gesture definitions 248 can be populated by a user through client device 202 or by a service provider remotely and synchronized to client devices. Gesture definitions 248 can include client device-specific, user-specific, and/or application or service-specific gestures and corresponding actions. In some embodiments, gesture definitions 248 can be updated dynamically by the user and/or by the service provider.

In some embodiments, a gesture can include a series of gestures (also referred to herein as sub-gestures or portions). As used herein a gesture that includes a series of gestures may be referred to as a compound gesture. One example of a compound gesture is a "swipe-and-hold" gesture that includes a swipe gesture, where the user makes an initial contact with the screen or other surface and moves along the surface in a given direction, and a hold gesture in which the user maintains contact for a period of time at the end of the swipe. Input analyzer 246 can determine how long contact is maintained during the "hold" portion of the swipe and hold gesture and, based on the "swipe" portion, can identify one or more actions to be performed using gesture definitions 248. In some embodiments, a swipe and hold gesture may execute a different, but related, action to that executed in response to a swipe action. For example, a swipe gesture can correspond to an action (archive, delete, add to list, defer) and the swipe and hold gesture can activate a rule generation for the corresponding action. As described further below, when a swipe and hold gesture is detected, a rule generation interface can be displayed to the user and rule data can be collected. The rule data can be provided to rule manager 250 through client interface 210. Using the rule data, rule manager 250 can update rules 240 applied by filter 234. This enables users to quickly and intuitively define rules in much the same way the users already interact with message management service 200, without requiring the user to wait for a pattern to be identified and a rule adopted by message management service 200.

Alternative swipe and hold gestures and corresponding actions may also be defined. For example, a swipe gesture may correspond to a "hide" action where a content item is hidden but not deleted from a user's account. A related swipe and hold gesture may be used to delete the content item. As such, swipe and hold gestures provide an intuitive way to increase the available actions that can be readily performed by the user while minimizing interface complexity.

Although embodiments are described herein with reference to a user input device in which gesture-based actions are detected on a substantially planar surface (e.g., a touchscreen), alternative embodiments may also be implemented. For example, a user input device may analyze the position and motion of the user input device in three-dimensional space (e.g., through accelerometers, gyroscopes, or other specialized hardware devices). Three-dimensional gestures may be defined and associated with various actions to be performed. Based on the motion of the user input device, a gesture can be identified and one or more corresponding actions can be performed on a selected message and/or content item.

Messaging service interface 214 can include various service modules 226a, 226b, each of which can be configured to communicate with a different one of messaging services 204a, 204b. For example, different messaging services 204 may support different communication protocols for access by external clients (e.g., IMAP, POP, MAPI/Exchange, custom APIs, and so on), and each service module 226 can be configured to use the appropriate protocol for a particular messaging service 204.

In some embodiments, messaging service interface 214 can present itself to messaging services 204a, 204b as a client accessing functionality of messaging services 204a, 204b, so that the existence of message management service 200 can be transparent to messaging services 204a, 204b. For example, if messaging service 204a supports IMAP, service module 226a can establish a persistent IMAP connection to a user's account with messaging service 204a, allowing messaging service 204a to deliver any incoming messages or message updates it receives for the user's account to message management service 200. Similarly, message management service 200 can deliver any outbound messages or message updates it receives from client device 200 to messaging service 204a. Persistent connections to services other than IMAP can also be maintained, or messaging service interface 214 can periodically poll various messaging services 204 to obtain new messages. The persistent connection can be maintained regardless of whether a given user currently has any client 202 connected to client interface 210, and message management service 200 can maintain synchronization with messaging services 204. A particular client 202 can disconnect from message management service 200 at any time and can be resynchronized with message management service 200 whenever it reconnects to message management service 200.

Message cache 216 can be a database or other data store managed by message management service 200 that provides storage and retrieval of messages. For example, messages can be stored and retrieved by reference to internal message identifiers assigned to each message by message management service 200 and/or messaging services 204. Message management service 200 can use message cache 216 to store copies of messages that are likely to be of interest to a client, such as recently received messages or messages found in a user-initiated search.

Messaging services 204 can maintain their own message stores or repositories independently of any action by message management service 200. In some embodiments, messaging service 204 can maintain a primary (or "master") store of messages for a user that can include all messages currently associated with that user's account (e.g., including sent messages, received messages, archived messages, etc.), and message cache 216 can store a subset of the user's messages (also referred to as a "window" of messages) as well as partial information about additional messages in the primary store that are not currently replicated in message cache 216. If client 202 requests a message that is not presently stored in message cache 216, message management service 200 can retrieve the message from the appropriate messaging service 204 and deliver it to client 202.

In operation, message management service 200 can obtain inbound messages from messaging services 204 and provide the messages to client 202. Message management service 200 can also receive outbound messages (e.g., messages to be sent) from client 202 and provide the messages to messaging service 204 for delivery to the recipient(s). Message management service 200 can also receive message update requests (including action requests and event information as described herein) from client 202 and can provide corresponding instructions to messaging service 204, e.g., to mark messages as read or unread, move a message to a folder, apply or remove a message tag, delete a message, and so on. Message management modules 212 can perform various operations on inbound and/or outbound messages, examples of which are described below.

It will be appreciated that message management service 200 is illustrative and that variations and modifications are possible. For example, other message management modules and/or operations can be provided, such as the ability to defer messages for later review and/or response, tag messages, search messages, and so on. In some embodiments, message management can include windowing (selecting and immediately delivering to a client a fixed number of messages deemed likely to be relevant, such as the 50 or 100 or some other number of most recent messages), backfilling (populating message cache 216 with messages in anticipation of client requests), message format conversion (e.g., converting between a message format used by a messaging service and a format optimized for display on a client), management of message folders or streams, message sorting, management of attachments, synchronization with messaging services 204 (e.g., relaying instructions from client 202 to move or modify messages) and so on.

Figure 3:
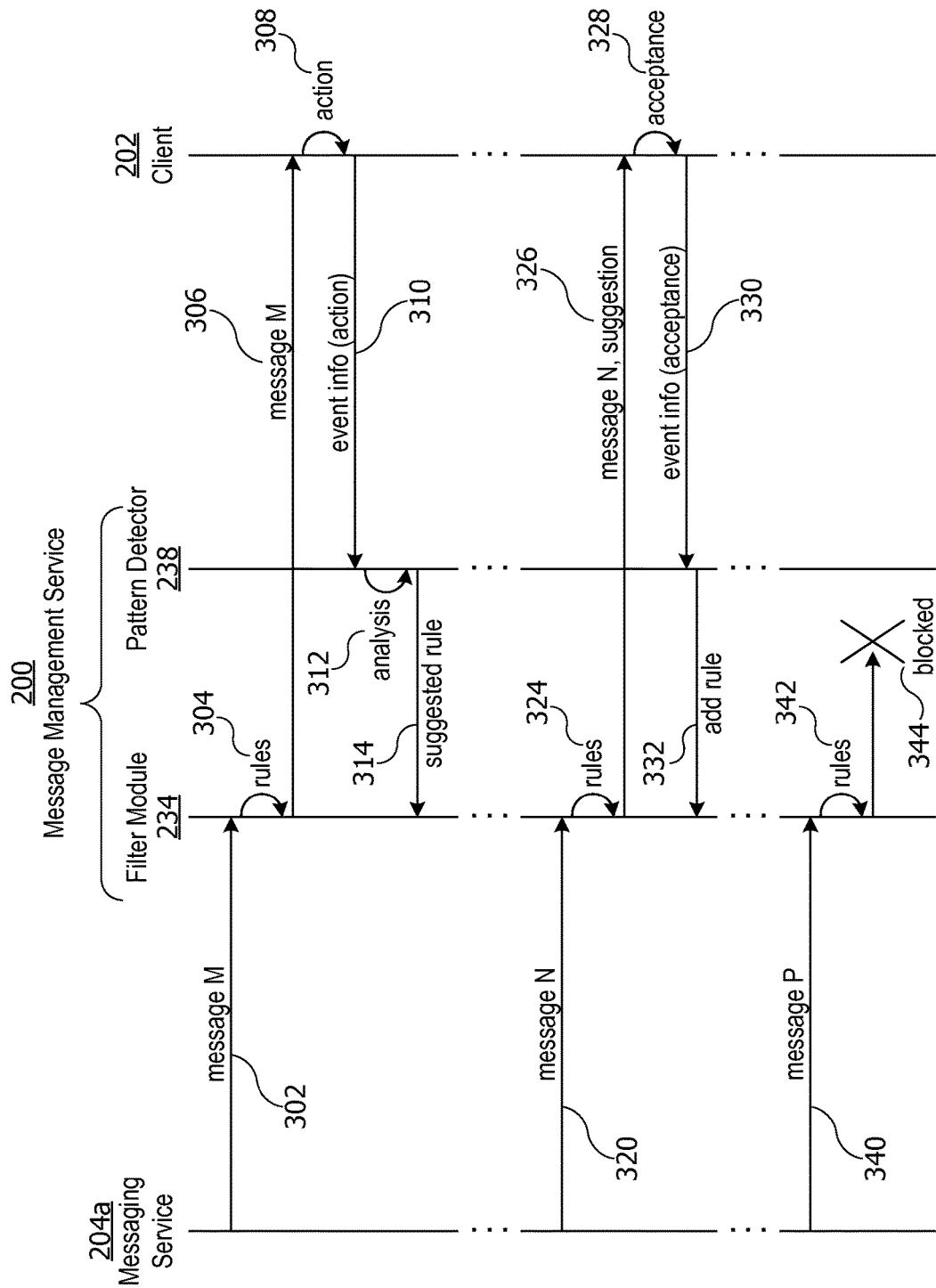
FIG. 3 is a simplified message passing diagram showing certain aspects of dynamic generation of a filtering rule according to an embodiment of the present invention.

In accordance with certain embodiments of the present invention, message management service 200 can dynamically generate filtering rules to facilitate user processing of messages. FIG. 3 is a simplified message passing diagram showing certain aspects of dynamic generation of a filtering rule according to an embodiment of the present invention. In this example, messaging service 204a can be an email service. Message management service 200 can include filter module 234 and pattern detector 238. Although not shown, it is to be understood that message management service 200 can include other modules to perform other operations related to messages.

At event 302, message M can be received at message management service 200. Message M can be any message received by messaging service 204a for the user of client 202. As described above, message management service 200 can obtain message M via a persistent IMAP connection or the like. Message M can be delivered to filter module 234. Filter module 234 can apply established rules to message M at event 304. In this example, it is assumed that the established rules do not result in non-delivery of message M to client 202; accordingly, message M can be delivered to client 202 at event 306. In some embodiments, the version of message M delivered to client 202 can be modified by message management service 200, e.g., to reformat or optimize the message for presentation at client 202.

Client 202 can present received message M to the user and detect a user action (event 308) responsive to message M. Client 202 can send event information indicative of action 308 to message management service 200 (event 310). In particular, the event information can be provided to pattern detector 238. For instance, as described above, event recorder 236 (not shown in FIG. 3) can receive the event information and generate an event record that is provided to pattern detector 238. Pattern detector 238 can perform analysis (event 312) using the received event information as input, in combination with information about other events. If pattern detector 238 detects a pattern, a suggested rule 314 can be provided to filter module 234. As described above, suggested rule 314 can specify a triggering condition and an action to be taken when the triggering condition is satisfied.

At some later time, at event 320, another message (N) can be received from messaging service 204a. Filter module 234 can apply filtering rules 324, including suggested rule 314, to the message. It is assumed in this example that message N satisfies the triggering condition for suggested rule 314. Accordingly, filter module 234 can deliver message N to client 202 together with suggestion metadata indicating suggested rule 314. For example, metadata can be added to message N indicating that a suggested rule applies to message N and further indicating the specific triggering condition and action defined by the suggested rule.

Client 202 can present message N to the user and can further present the suggested rule to the user; an example of presenting a suggested rule to the user is described below. Assuming the user accepts the suggestion, as indicated by acceptance 328, client 202 can send event information 330 including an indication of the acceptance, to message management service 200. For example, pattern detector 238 can receive acceptance 330 and instruct filter module 234 to establish the suggested rule (instruction 332). Alternatively, filter module 234 can receive acceptance 330 and add the suggested rule without an instruction from pattern detector 238.

Thereafter, at event 340, message P can be received, and filter module 234 can apply rules 342, now including the rule added by instruction 332. Applying the rule can include taking the action indicated by the rule if the triggering condition is satisfied. Depending on the particular rule, this action can include deleting message P, moving message P to a folder or list, deferring message P for later delivery to client 202, or the like. In this example, taking the action results in message P not being delivered to client 202, shown as blocked delivery 344. In other instances, message P might be delivered even after applying a rule; examples are described below.

It will be appreciated that FIG. 3 is illustrative and that variations and modifications are possible. For instance, a user action on a message or application of a filtering rule can result in communication of an update instruction to messaging service 204a, e.g., to move a message to a folder, to delete a message, or the like. It is expected that other messages can be received and that not all messages will satisfy the triggering condition of a given rule. Further, while FIG. 3 shows all messages being received from the same messaging service, it is to be understood that a different messages can be received for the same user from different messaging services and that analysis of the message can be performed without regard to which messaging service was the source of a message.

The behavior described with reference to FIG. 3 allows message filtering rules to be dynamically generated based on user actions. For example, the sequence of events 302-310 can be repeated multiple times for different messages to build up a set of event records from which a pattern can be detected. Suggestion of the same rule or different rules can be repeated as the user continues to interact with message management service 200 via client 202.

As a result of operation of pattern detector 238, a filtering rule can be generated without an explicit user instruction to do so. That said, it can be useful to obtain user confirmation before establishing a new rule (e.g., as shown at events 326-330 of FIG. 3). A user experience of automatic filter generation can be further understood with reference to FIGS. 4A-4C, which show user interface screens for a client device according to an embodiment of the present invention.

FIG. 4A shows a user interface screen 400 that can be presented on a client device (e.g., client 202) according to an embodiment of the present invention. User interface screen 400 can include a message list 402 corresponding to the user's inbox. A control section 404 can be provided to allow the user to take other actions, such as viewing previously created lists of messages, composing a message, searching messages, and so on. Message list 402 can include messages 412, 414, 416. (In this example, message 416 is a most recent message in a thread of messages, and message 416 allows the user to access other messages in the thread, as indicated by badge 418.) In this example, user interface screen 400 can provide a unified interface that allows the user to view a single list 402 that includes messages from all of her messaging-service accounts that are linked to message management service 200. In some embodiments, the client device can allow the user to select whether to view messages for all messaging-service accounts or fewer than all accounts (e.g., one account at a time).

User interface screen 400 can be presented on a touch-screen device, and the user can interact with message list 402 using touch gestures such as tapping or dragging. For instance, as shown in FIG. 4B, a user can drag message 412 partway to the left; gesture indicator 420 shows a contact point moving to the left, indicating dragging. In some embodiments, gesture 420 can be interpreted as indicating that message 412 should be deferred for later action, and this interpretation can be communicated to the user, e.g., by presenting deferral icon 422 as shown. Execution of gesture 420 may also result in user interface screen 400 presenting a menu (not shown) of options for how long to defer the message (e.g., until this evening, until tomorrow morning, for 24 hours, for a week, etc.). Other gestures can be defined to indicate other actions, such as moving the message to a list, archiving or deleting the message, or the like. Regardless of the specific user action, client 202 can report the action to message management service 200 (e.g., as event information 310 of FIG. 3).

In some embodiments, a single user gesture can indicate that an action should be performed on multiple messages. For instance, message 416 represents a thread containing three messages, and performing deferral gesture 420 on message 416 can result in deferring all messages received so far in the thread. For purposes of pattern detection by message management service 200, an action performed on multiple messages in a thread can be treated as multiple instances of an action, generating multiple event records. This can allow pattern detector 238 to detect a pattern sooner where a user acts on a thread rather than individual messages.

The user interface of FIGS. 4A and 4B can also be used to determine when to present a suggested rule to a user. For purposes of illustration, suppose that the user has previously received multiple messages from the same sender as message 412 and, for each such message, the user has performed the same deferral action as shown in FIG. 4B. As described above, pattern detector 238 can detect this pattern and suggest a rule. The next time a message comes in from the same sender, message management service 200 can provide the suggested rule to client 202 to present to the user, e.g., by including suggestion metadata with the message. When client 202 receives a suggested rule for presentation, client 202 can display the message normally (e.g., as shown in FIG. 4A), and the user can perform the deferral action, as shown in FIG. 4B. In this case, based on the suggestion metadata, client 202 can recognize that the user's action matches the resulting action for the suggested rule. This can result in client 202 prompting the user to establish the rule.

Figure 4C:
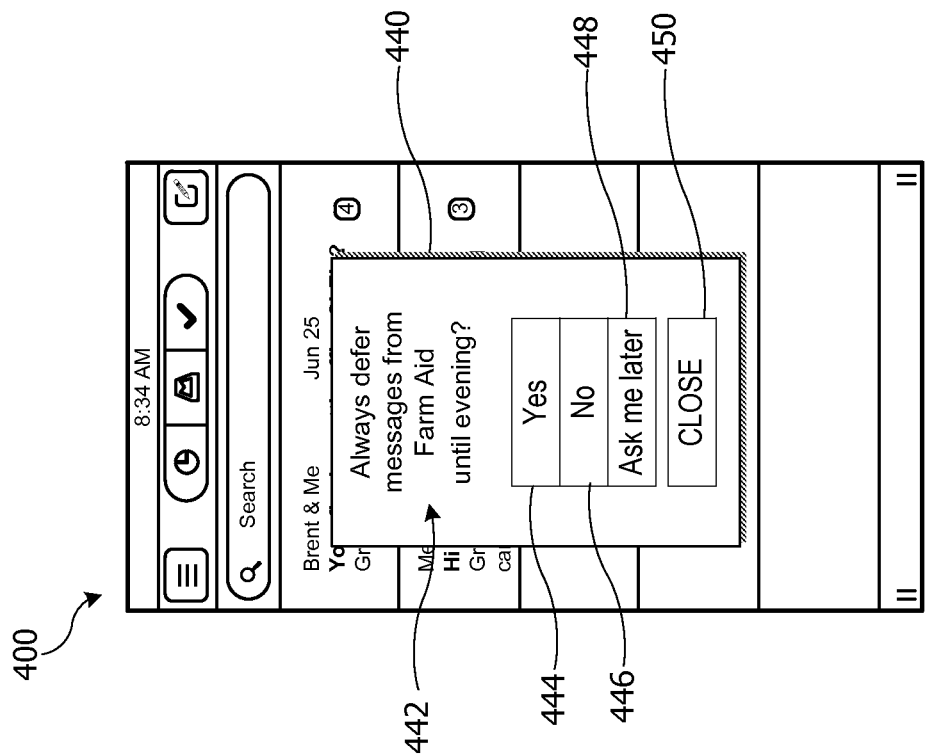

FIG. 4C shows an example of a prompt 440 for a suggested rule that can be displayed by client 200 according to an embodiment of the present invention. In this example, prompt 440 includes a description 442 that states the suggested rule (including the triggering condition and resulting action) and offers options in the form of virtual buttons. "Yes" button 444 can result in the suggested rule being established and therefore automatically applied to future incoming messages that satisfy the triggering condition. "No" button 446 can result in the suggested rule not being established. As described below, "No" button 446 can also result in the suggested rule not being suggested again. "Ask me later" button 448 can also result in the suggested rule not being established, but in this case the user can be prompted again next time a message that triggers the suggested rule is received and acted upon. "Close" button 450 can result in the suggested rule not being established, and in some embodiments, repeated user selection of "Close" button 450 can suspend the presentation of suggested rules. Other prompts and response options can also be provided, and in some embodiments, a user can input a response by performing a gesture rather than touching a particular button.

Figure 5B:
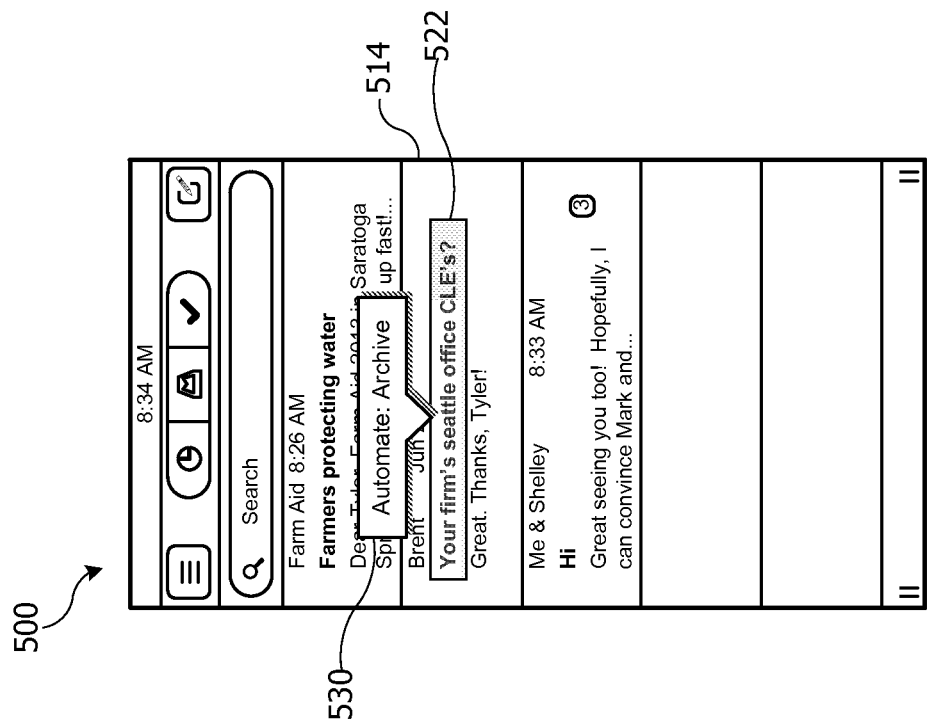
FIGS. 5A-5C show user interface screens for a client device according to another embodiment of the present invention
Figure 5A:
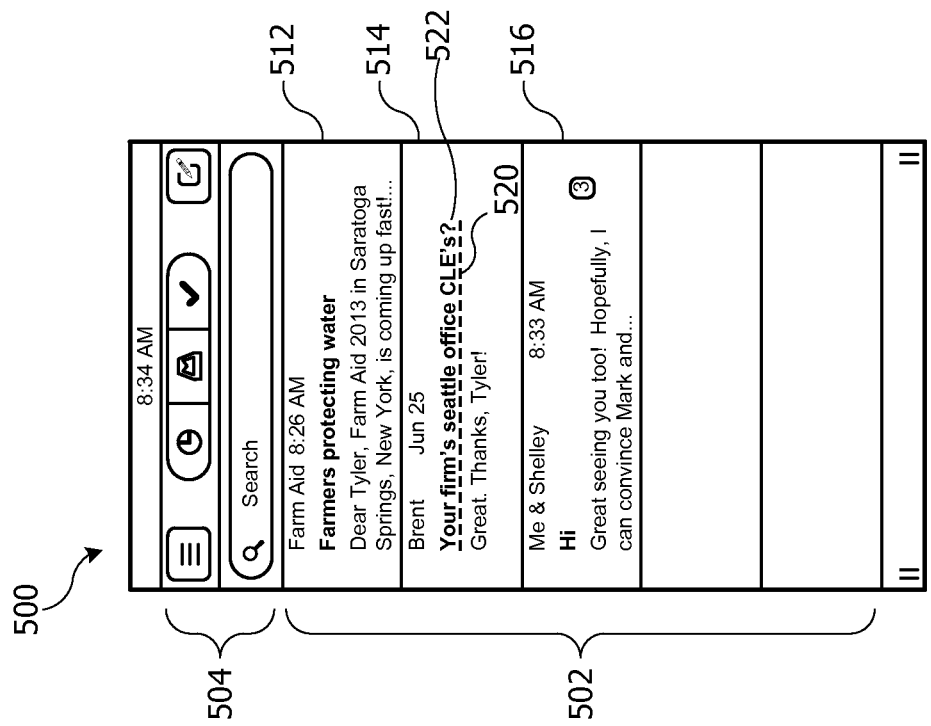
Figure 5C:
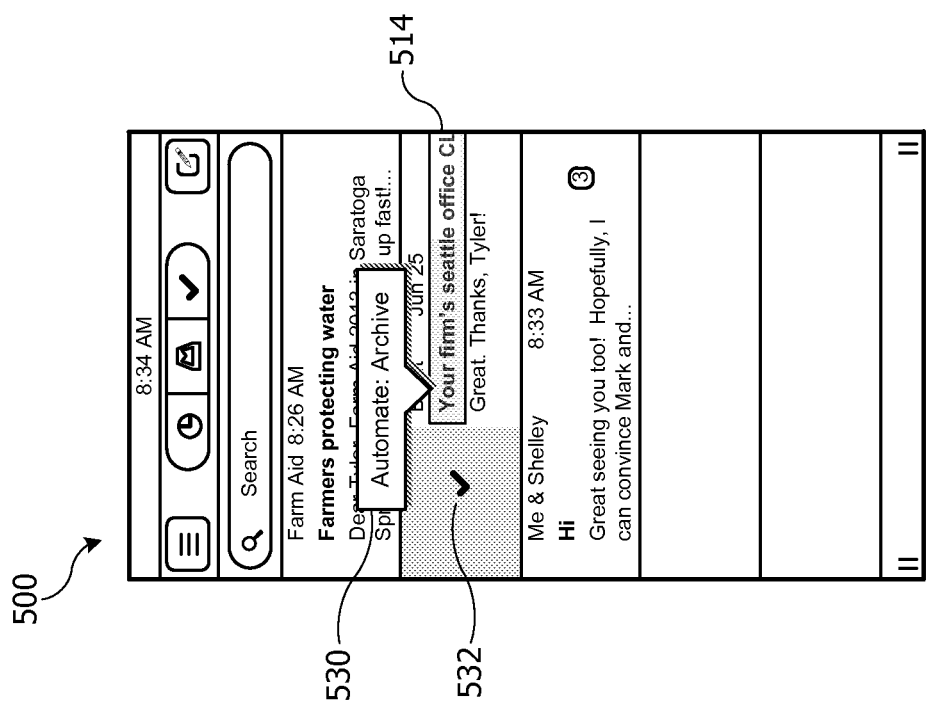

FIGS. 5A-5C show user interface screens for a client device according to another embodiment of the present invention FIG. 5A shows a user interface screen 500 that can be presented on a client device (e.g., client 202) according to an embodiment of the present invention. User interface screen 500 can include a message list 502 corresponding to the user's inbox. A control section 504 can be provided to allow the user to take other actions, such as viewing previously created lists of messages, composing a message, searching messages, and so on. Message list 502 can include messages 512, 514, 516. (Similarly to FIG. 4A, some messages such as message 516 can represent a thread of related messages.) In this example, user interface screen 500 can provide a unified interface that allows the user to view a single list 502 that includes messages from all of her messaging-service accounts that are linked to message management service 200. In some embodiments, the client device can allow the user to select whether to view messages for all messaging-service accounts or fewer than all accounts (e.g., one account at a time).

In FIG. 5A, the option to establish a filtering rule is indicated by including visual indicia in message list 502. For example, dotted underline 520 in message 514 can indicate that a suggested rule was received with message 514. The triggering condition of the suggested rule can be indicated by the location of dotted underline 520. In this example, dotted underline 520 underlines subject line 522, indicating that the triggering condition corresponds to the subject line of the message. A triggering condition corresponding to a sender can be indicated, e.g., by underlining the sender's name, and so on. In some embodiments, the nature of the resulting action of the suggested rule can be indicated by the line style and/or line color. For instance, a yellow line can indicate that the resulting action is deferral, a green line can indicate archiving, a red line can indicate deleting, and so on.

A user can tap on message 514 or more specifically on subject line 522 to find out more about the rule. FIG. 5B shows user interface screen 500 after the user taps on message 514 according to an embodiment of the present invention. Subject line 522 (or any other portion of message 514 that corresponds to the triggering condition) can become highlighted, to draw the user's attention to the triggering condition. In some embodiments, the color of the highlighting can correspond to the resulting action. In addition, a prompt 530 can be presented to prompt the user to confirm whether the suggested rule should be accepted. As shown, prompt 530 can include text and/or icons to indicate the resulting action. In this example, the resulting action is to archive message 514. In other instances, prompt 530 can show further information. For instance, if the resulting action is to defer the message, prompt 530 can indicate the deferral period; if the resulting action is to move the message to a folder or list, prompt 530 can identify the specific folder or list.

In some embodiments, the user can accept the suggested rule by tapping on prompt 530 and decline the suggested rule by tapping elsewhere on screen 500. Other responses can also be communicated by gestures. For example, in some embodiments, a swipe gesture to the right across prompt 530 can correspond to declining the rule (similarly to "No" button 446 of FIG. 4C described above), and a swipe gesture to the left across prompt 530 can correspond to deferring a decision (similarly to "Later" button 448 of FIG. 4C).

FIG. 5C shows user interface screen 500 after the user accepts the suggested rule, e.g., by tapping prompt 530, according to an embodiment of the present invention. In this example, the client animates taking the action as if the user had performed the gesture to take the action manually. In this example, the rule automatically archives the message, and message 514 is shown sliding off to the right, and archive icon 532 is presented in the space. In this example, the user need not perform a swipe gesture; the animation instead provides a visual confirmation of the action being taken.

In the embodiments described above, pattern detector 238 can analyze records in event records data store 242 to detect patterns, such as a correlation between a particular set of message features and a resulting user action. Based on the detected patterns, rules may be automatically generated and suggested to the user. For example, if the user generally snoozes messages from a particular sender without reading them until after work hours, this may indicate that the user does not want to receive messages from that sender until after work. Pattern detector 238 can generate a rule to defer messages from that sender and suggest the rule to the user, e.g., by displaying a prompt to the user. As such, in some embodiments, a particular number of events need to occur and be stored in event records data store 242 before rules can be generated and suggested. Alternatively, in some embodiments, a user can define a rule manually by entering a detailed view of a message (e.g., a view that shows the contents of the message) and select an icon (such as those shown in control section 404) and long tap the icon (archive, delete, etc.) to bring up a rule definition prompt (such as prompt 440).

Gesture-based rule generation can be provided to simplify the process of manually defining rules. FIGS. 6A-6B show user interface screens for a client device according to an embodiment of the present invention. In some embodiments, a user can make a swipe gesture to indicate a particular action, or set of actions, to be performed on a message. For example, the swipe gesture can include the user making contact with the user interface 600 at a contact point 602 and then dragging the contact point in a particular direction to another position. Different actions may be associated with different directions and/or with the length of the user's swipe. For example, a swipe to the right that traverses a first distance of the screen of the user device may correspond to an archive action, whereas a swipe that traverses a second distance can correspond to a delete action. In some embodiments, a gesture can include a series of gestures. As used herein a gesture that includes a series of gestures may be referred to as a compound gesture. One example of a compound gesture is a "swipe-and-hold" gesture that includes a swipe gesture, where the user makes an initial contact with the screen or other surface and moves along the surface in a given direction, and a hold gesture in which the user maintains contact for a period of time at the end of the swipe.

As described above, a gesture can be associated with one or more actions in gesture definitions 248. For compound gestures, each portion of the gesture may be associated with a different action or set of actions. In some embodiments, different applications, users, and/or client devices can be associated with different sets of actions.

In the example shown in FIG. 6A, the user makes contact with user interface 600 at contact point 602 and swipes right, corresponding to an archive action. At contact point 603 the user can hold the gesture to indicate that the gesture should be applied as a rule. This gesture may be referred to herein as a "swipe and hold" gesture. A time period may be defined during which the user maintains the hold to bring up a rule definition prompt. While holding, a timer visualization 604 can be displayed. Timer visualization 604 can both indicate the action associated with the swipe (in this example, a checkmark that corresponds to an archive action) and the time left (in this example, an arrowed line forming a circle). As shown in FIG. 6B, once the gesture has been held for the time period, a completed circle 606 is displayed. In some embodiments, the selected message may also be replaced by an archive animation, or other action-appropriate visualization, indicating that the archive action has been performed on the selected message. A rule definition prompt 608, including an instruction message 610, can then be displayed, prompting the user to define a rule for the selected and similar messages.

As shown in FIG. 6B, the user may be prompted to select the senders 612 to which the rule applies. In some embodiments, when the selected message is associated with a single sender, the sender's details (e.g., name, email address, phone number, etc.) may be automatically populated in 612. In some embodiments, the user can define the rule to apply to a conversation 614 associated with the selected message. In some embodiments, the user can define the recipients 616 to which the rule is to be applied. In some embodiments, when the selected message is associated with a single recipient, the recipient's details (e.g., name, email address, phone number, etc.) may be automatically populated in 612. In some embodiments, when the message is associated with a single recipient, box 616 may be omitted from prompt 608.

In some embodiments, client device 202 can send a request to rule manager 250 to generate a rule based on the rule data provided by the user. The rule, as defined by the user, can then be added to filtering rules 240 by rule manager 250.

In the example of FIG. 6, a swipe and hold gesture is described, however alternative compound gestures may also be used. For example, a hold and swipe gesture may be defined in which the user selects a content item by making contact with a touchscreen, holds that contact for a period of time, and then swipes in a particular direction. The initial hold gesture can then change the resulting action performed following the swipe, similarly to the example of FIG. 6 described above.

Figure 7:
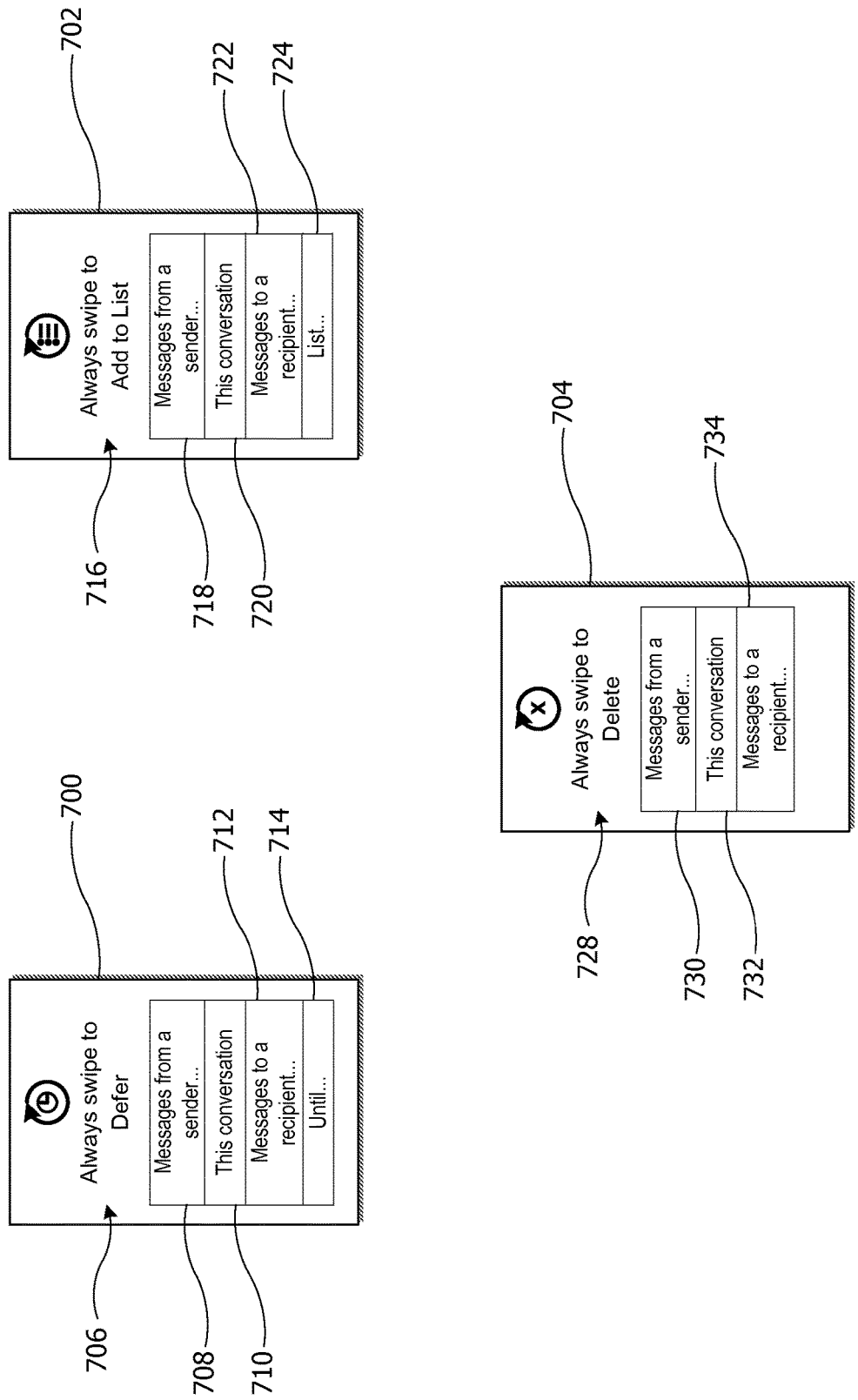
FIG. 7 shows alternative filter definition prompts according to an embodiment of the present invention.

FIG. 7 shows alternative rule definition prompts according to an embodiment of the present invention. As shown in FIG. 7, different actions may be associated with different action-specific rule definition prompts. For example, prompt 700 may be associated with a deferral action, prompt 702 may be associated with an add to list action, and prompt 704 may be associated with a delete action.

Interface 700 can include a prompt-specific message 706 and several prompts requesting additional information to define a rule to defer the selected and similar messages. As shown in FIG. 7, the user may be prompted to select the senders 708 to which the rule applies. As described above, when the selected message is associated with a single sender, the sender's details (e.g., name, email address, phone number, etc.) may be automatically populated in 708. In some embodiments, the user can define the rule to apply to a conversation 710 associated with the selected message. In some embodiments, the user can define the recipients 712 to which the rule is to be applied. In some embodiments, when the selected message is associated with a single recipient, the recipient's details (e.g., name, email address, phone number, etc.) may be automatically populated in 712. In some embodiments, when the message is associated with a single recipient, box 712 may be omitted from interface 700.

In some embodiments, interface 700 can further include a box 714 requesting a time for which the message (and similar messages to which the rule applies) is to be deferred. When box 714 is selected, a time definition prompt (not shown) may be displayed in which the user can enter and/or select a time and/or date for deferral of the message. For example, the user may define that all messages from a particular sender should be deferred until after working hours. In some embodiments, the deferral time may be defined during the hold 603 portion of the gesture. For example, after the timer visualization 606 completes the circle, the animation may change to display hours, dates and times, or other temporal values that are determined based on how long the user continues to hold the gesture. In some embodiments, the temporal value corresponding to how long the user held the gesture can be autopopulated in box 714. As described above, the selected rule data, as provided by the user, can then be provided to rule manager 250 which can generate a corresponding rule to be added to filtering rules 240.

As shown in FIG. 7, in some embodiments, interface 702 can include a prompt-specific message 716 and several prompts requesting additional information to define a rule to add the selected and similar messages to a list. Like in prompt 700, in prompt 702 the user may be prompted to select the senders 718, conversation 720, and/or recipients 722 to which the rule applies. Prompt 702 may further include a box 724 requesting the user identify a list to which the message (and similar messages to which the rule applies) is to be added. When box 714 is selected, a list definition prompt (not shown) may be displayed in which the user can select from previously defined lists or may create a new list.

Prompt 704 can include a prompt-specific message 728 and several prompts requesting additional information to define a rule to delete the selected and similar messages. Like in prompt 700 and 702, in prompt 704 the user may be prompted to select the senders 730, conversation 732, and/or recipients 734 to which the rule applies. In some embodiments, a confirmation message (not shown) can be displayed before saving a rule that automatically deletes messages.

Figure 8:
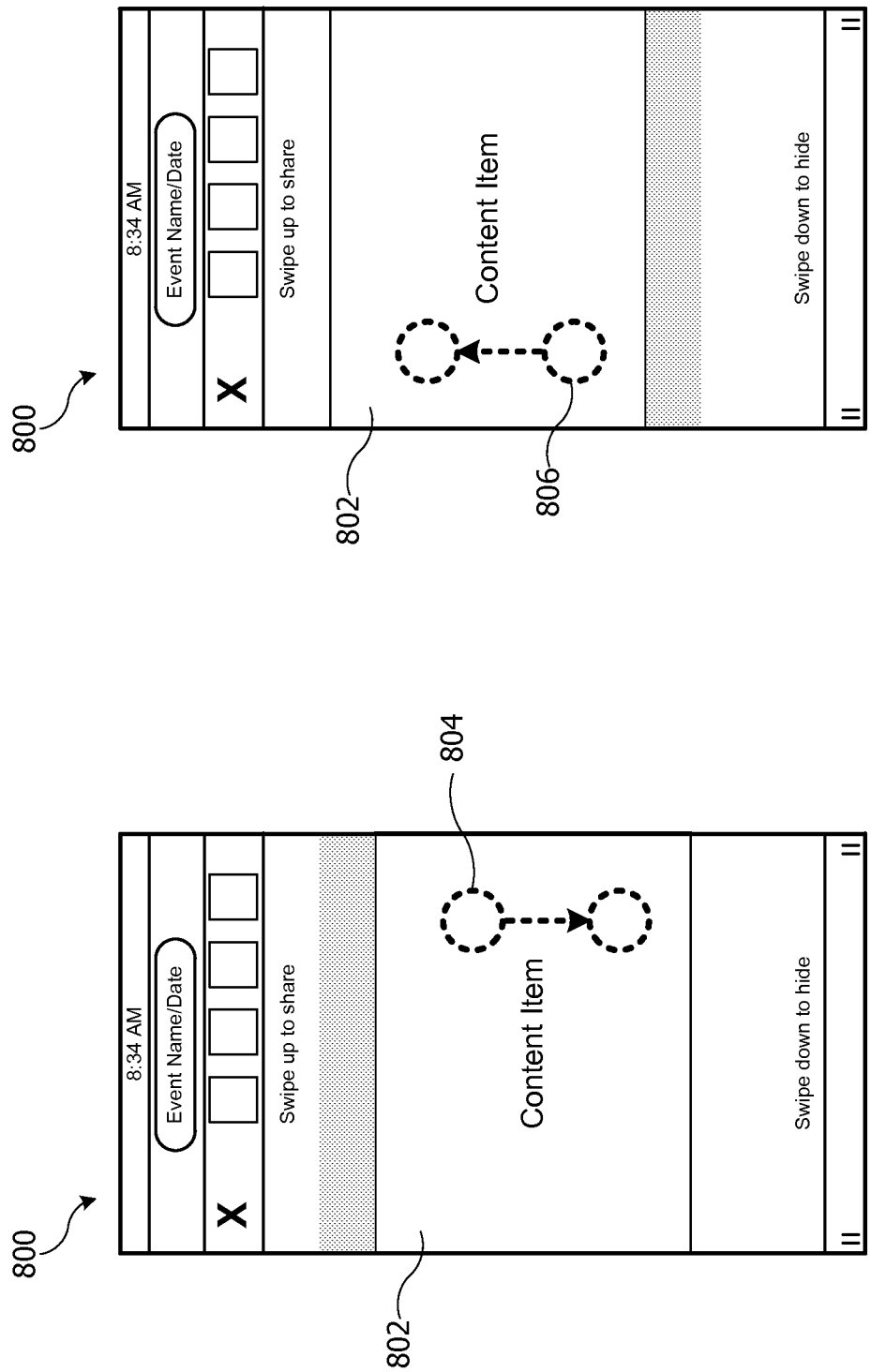
FIG. 8A-8B show user interface screens for a client device according to another embodiment of the present invention.

FIG. 8A-8B show user interface screens for a client device according to another embodiment of the present invention. In some embodiments, the swipe and hold gesture may be applied to other user interfaces that use a swipe gesture to correspond to a particular action. As described above with respect to FIGS. 6A-6B and 7, the swipe and hold gesture may execute a different, but related, action to the swipe action. For example, in the above examples, the swipe action corresponds to an action (archive, delete, add to list, defer) and the swipe and hold gesture activates a rule generation for the swipe action. In the embodiment shown in FIGS. 8A-8B swipe and hold gestures may be applied to an interface for viewing content items (e.g., images, video, documents, or other content items) stored in an online content management service. Online content management services allow users to access and manage content across multiple devices using the Internet. In a typical online content management service, a user establishes an account with the service provider and associates various content items with the account. For example, some online content management services can allow the user to store content items (including but not limited to text documents; email messages; text messages; other types of messages; media files such as photos, videos, and audio files; and/or folders containing multiple files) and to selectively allow other users to access the content items. Content items can be stored in a master repository maintained by the service provider and mirrored to or synchronized with local copies on various user devices.

As shown in FIG. 8A, user interface 800 may display one or more content items 802. In the example shown in FIG. 8A, content item 802 may be an image, and user interface 800 may enable at least two swipe gestures, associated with at least two actions, to be performed on content item 802. A swipe up gesture may cause content item 802 to be shared and a swipe down gesture may cause content item 802 to be hidden. Swipe and hold gestures may be defined to be associated with actions relating to sharing or hiding content items. For example, swipe and hold gesture 804 may be associated with a swipe down gesture. Swipe and hold gesture 804 may display a prompt (not shown) to the user to define a rule to hide similar content items (e.g., based on the content of the item, such as faces identified in an image). Alternatively, swipe and hold gesture 804 may automatically move the content item to a "hidden" folder such that the content item is not displayed on the user device, or the swipe and hold gesture 804 may delete the content item from the device or from the online content management service.

As shown in FIG. 8B, swipe and hold gesture 806 may be associated with a swipe up gesture. Swipe and hold gesture 806 may display a prompt (not shown) to the user to define a rule to share similar content items (e.g., based on the content of the item, such as faces identified in an image). Alternatively, swipe and hold gesture 806 may automatically move the content item to a particular "shared" folder such that the content item is shared according to the sharing settings of the shared folder. This may enable the user to share the content item with a particular set of users, for a particular length of time, or according to other sharing settings, without requiring the user to input additional sharing details.

It will be appreciated that the user interface screens of FIGS. 4A-4C, 5A-5C, 6A-6B, 7, and 8A-8B are illustrative and that variations and modifications are possible. User input controls, layouts, icons, and the like can be modified based on the client device, the set of functions to be supported, and/or a design esthetic of the client software.

Examples of specific processes and algorithms that can be used to implement dynamic generation of filtering rules will now be described.

Figure 9:
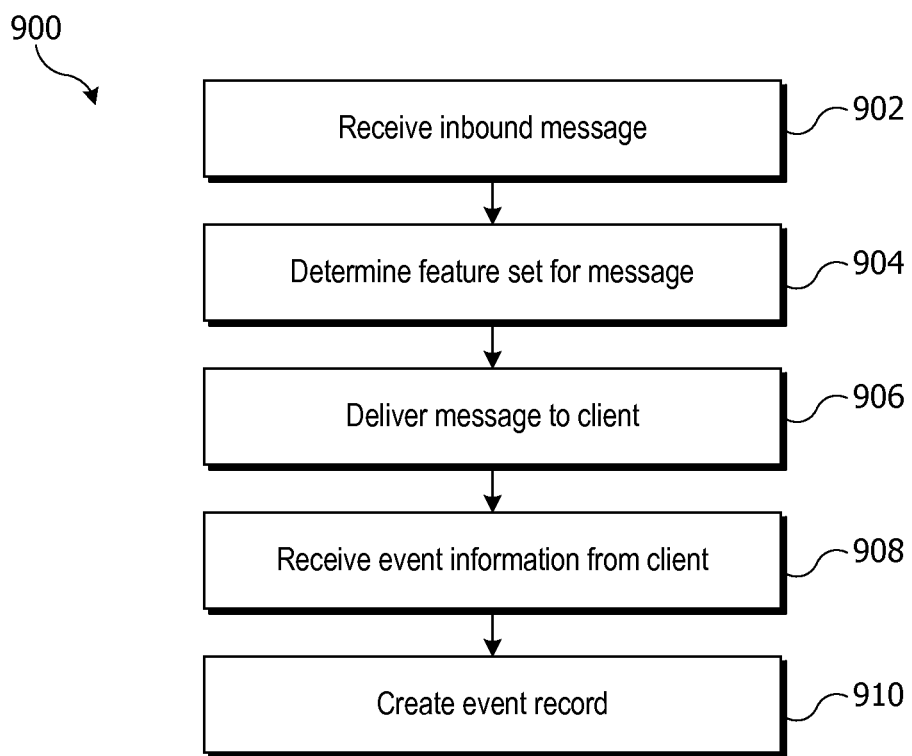
FIG. 9 shows a flow diagram of a process for generating an event record according to an embodiment of the present invention.

As described above, generation of filtering rules can be based on analysis of event records. FIG. 9 shows a flow diagram of a process 900 for generating an event record according to an embodiment of the present invention. Process 900 can be implemented, e.g., in event recorder 236 of message management service 200 of FIG. 2. Process 900 can be performed for each new inbound message received by message management service 200.

At block 902, an inbound message is received. In some embodiments, the inbound message can be a new message that has not previously been delivered to client 202 and that the user has not previously read or acted on (e.g., using a different client). At block 904, a set of message features can be determined for the inbound message. The message features can include any characteristics, properties, or metadata of the message that will later be provided to pattern detector 238. Examples can include: a subject line of the message; the sender name or address; an identifier of the messaging service from which the message was received; a recipient list of the message; time of sending the message; time of receiving the message (at messaging service 204 or message management service 200); message size; a representation of some or all of the message content; message format (e.g., plain text, HTML); presence of attachments and type of attachments; and so on.

At block 906, the message can be delivered to a client (e.g., client 202 of FIG. 2), which can present the message to the user. At block 908, if the user takes an action in regard to the message, event recorder 236 can receive event information from the client. The event information can include an indication of the action taken. In some embodiments, the event information can also include client context information such as: the type of client device (e.g., mobile phone, laptop computer, desktop computer); identity of client device (e.g., a specific device name or other unique identifier); time when the action was taken; location of the client device when the action was taken (e.g., a defined location such as "home" or "office," specific location coordinates, or other location indicia such as identifiers of available wireless networks); and so on.

At block 910, event recorder 236 can create an event record that incorporates the message feature set determined at block 904 and the event information received at block 908. Process 900 can be repeated for any number of messages and user responses to generate a set of event records. The event records can be stored, e.g., in event records data store 242 of FIG. 2. In some embodiments, the event records can include records pertaining to messages received for the user from different messaging services.

Figure 10:
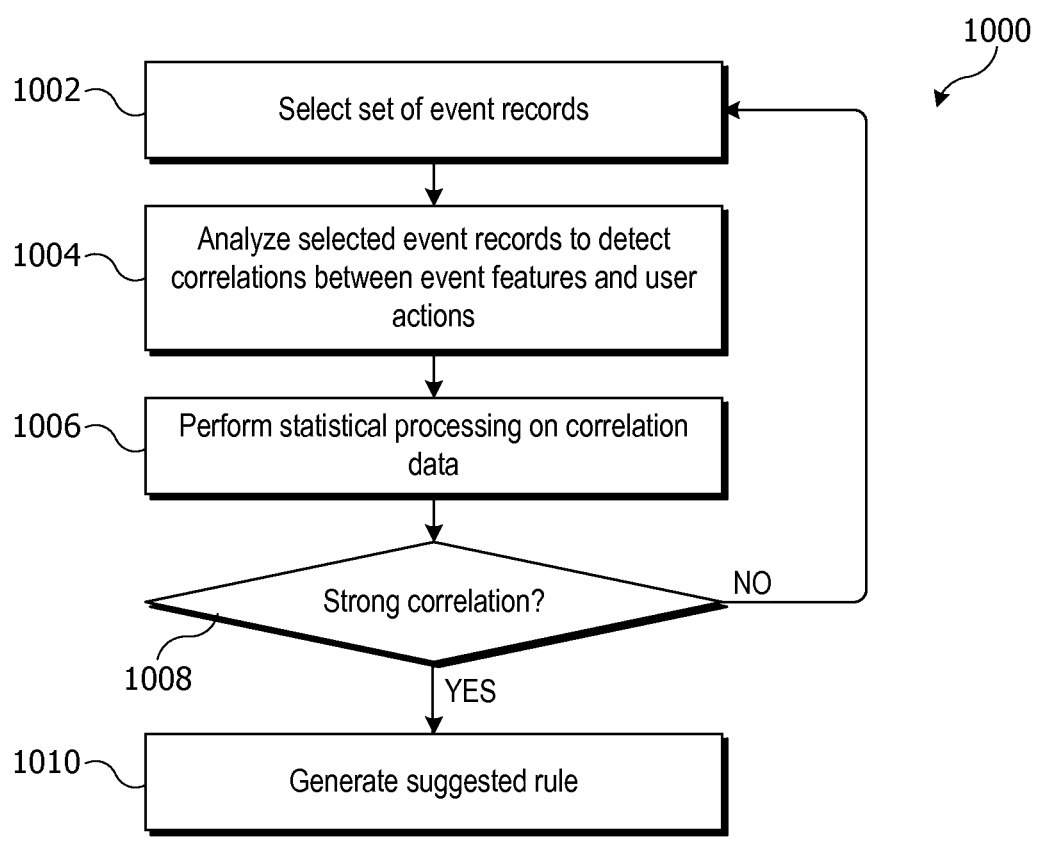
FIG. 10 is a flow diagram of a process for detecting a pattern of user action based on event records according to an embodiment of the present invention.

After a number of event records have been collected, they can be analyzed to detect patterns of user action. FIG. 10 is a flow diagram of a process 1000 for detecting a pattern of user action based on event records according to an embodiment of the present invention. Process 1000 can be implemented, e.g., in pattern detector 238 of message management service 200 of FIG. 2.

At block 1002, pattern detector 238 can select a set of event records from event records data store 242 of FIG. 2. The selected set can include all event records for a particular user account (e.g., including events reported by multiple clients accessing the same user account and/or events related to messages for the same user account sourced from different messaging services). In some embodiments, selection at block 1002 can include prefiltering based on features or combination of features of the messages. For instance, if pattern detector 238 is used to detect patterns pertaining to subjects or senders, event records for a particular subject or sender can be ignored if only one or two event records have that subject or sender. Prefiltering can also employ other criteria, such as the recency of various event records, total number of event records, and so on. As another example, prefiltering can include limiting the set of event records to events where the user did not read the message prior to taking the action, on the assumption that if the user read the message before deciding what to do with it, automated filtering is less likely to be feasible or desirable. Determining whether the user read the message can be based on event information provided by the client. For instance, the event information can indicate whether the user opened the message from a message list (e.g., by tapping on a message in message list 402 of FIG. 4A) before acting on it and/or how long the user spent looking at the message after opening it and before acting on it. For instance, if the user looked at the opened message for a second or less, this may indicate that the message contains a readily recognizable cue as to how to process it; if the user looked at the message for several seconds, the cue may be harder to detect.

At block 1004, pattern detector 238 can analyze the selected set of event records to detect correlations between specific event features and resulting user actions. A variety of analysis techniques can be used, and the analysis can consider a single feature of the message and/or the context information in isolation or a combination of features of the message and/or the context information.

For example, in some embodiments, the analysis can be based on event counts. Pattern detector 238 can determine, from the event records, the number of messages ($N_M$) having a particular message feature (or combination of features), such as the number of messages received from a specific sender or the number of messages received with specific words in the subject line. Pattern detector 238 can also determine the number of times ($N_A$) the user took a particular action on a message having the particular feature(s). A correlation can be detected, e.g., based on the ratio $N_A/N_M$. Any number of single features and/or combinations of features can be analyzed in this manner to identify instances where the features correlate with a specific action by the user. Any feature or characteristic of messages can be incorporated into the analysis.

In some embodiments, the analysis at block 1004 can also be based in part on context information provided by the client. For example, a user may defer messages having a certain feature (e.g. from a particular sender or addressed to a particular group of users) and keep deferring them until she is in a particular location (e.g., at home) or using a particular client device (e.g., a tablet or laptop as opposed to a mobile phone), at which time she reads the messages instead of continuing to defer. Such patterns can be detected using multivariate analysis techniques that provide for flexible and generalized detection of correlations between a set of input variables (in this case corresponding to message features and/or elements of the context information) and a particular outcome (in this case a specific action that is consistently taken). Machine-learning algorithms such as artificial neural networks can be implemented to support analysis of any degree of complexity. In some instances, the complexity can be limited, e.g., by limiting the number of message features and/or context elements considered at once.

The analysis at block 1004 can produce correlation metrics indicating the degree of correlation between a feature set (including message features and/or elements of context information) and a particular user action (e.g., $N_A/N_M$ as defined above). At block 1006, further statistical processing can be performed on the correlation metrics to identify correlations that are strong enough to serve as a basis for suggesting a rule. In general, the processing at block 1006 can include any algorithm capable of distinguishing a statistically significant correlation from one that is likely to occur just by coincidence. In some embodiments, the correlation can be required to be 100% over some set of recent event records. For example, block 1006 can require that the user took the same action with regard to all of the most recent three (or more) messages having the relevant feature set. As another example, block 1006 can require a weaker correlation over a larger set of event records; for example, a correlation can be regarded as strong if the user has taken the same action at least 95% of the time for the last twenty messages having the relevant feature set.

At block 1008, pattern detector 238 can determine whether any strong correlations were identified, e.g., by reference to the analysis at block 1006. If not, process 1000 can return to block 1002 to perform further analysis on the event records. In some embodiments, further analysis can be suspended until additional event records are available, or the same set of records can be analyzed in a different manner, e.g., by reference to a different feature set or with different prefiltering criteria. If, at block 1008, a strong correlation is detected, then at block 1010, pattern detector 238 can generate a suggested rule. In some embodiments, the suggested rule can take the general form of "do {action} when {condition} is satisfied." The {condition}, also referred to herein as a triggering condition, can identify the combination of message features and/or context elements that were found to correlate strongly with a particular action. The {action}, also referred to herein as a resulting action, can identify the particular action, such as deferring or archiving the message. The suggested rule can be communicated to filter module 234 as described above.

Process 1000 can be repeated as more events occur, and the analysis can include messages received for the user from multiple different messaging services. As noted above, in some embodiments, event records can expire, e.g., due to age or a large number of subsequent events. Accordingly, at different times, process 1000 can involve analyzing different sets of event records, and the suggested rules can evolve as user behavior changes or becomes better understood by message management service 200. At various times, execution of process 1000 can result in generation of zero, one, or more than one suggested rule.

Figure 11:
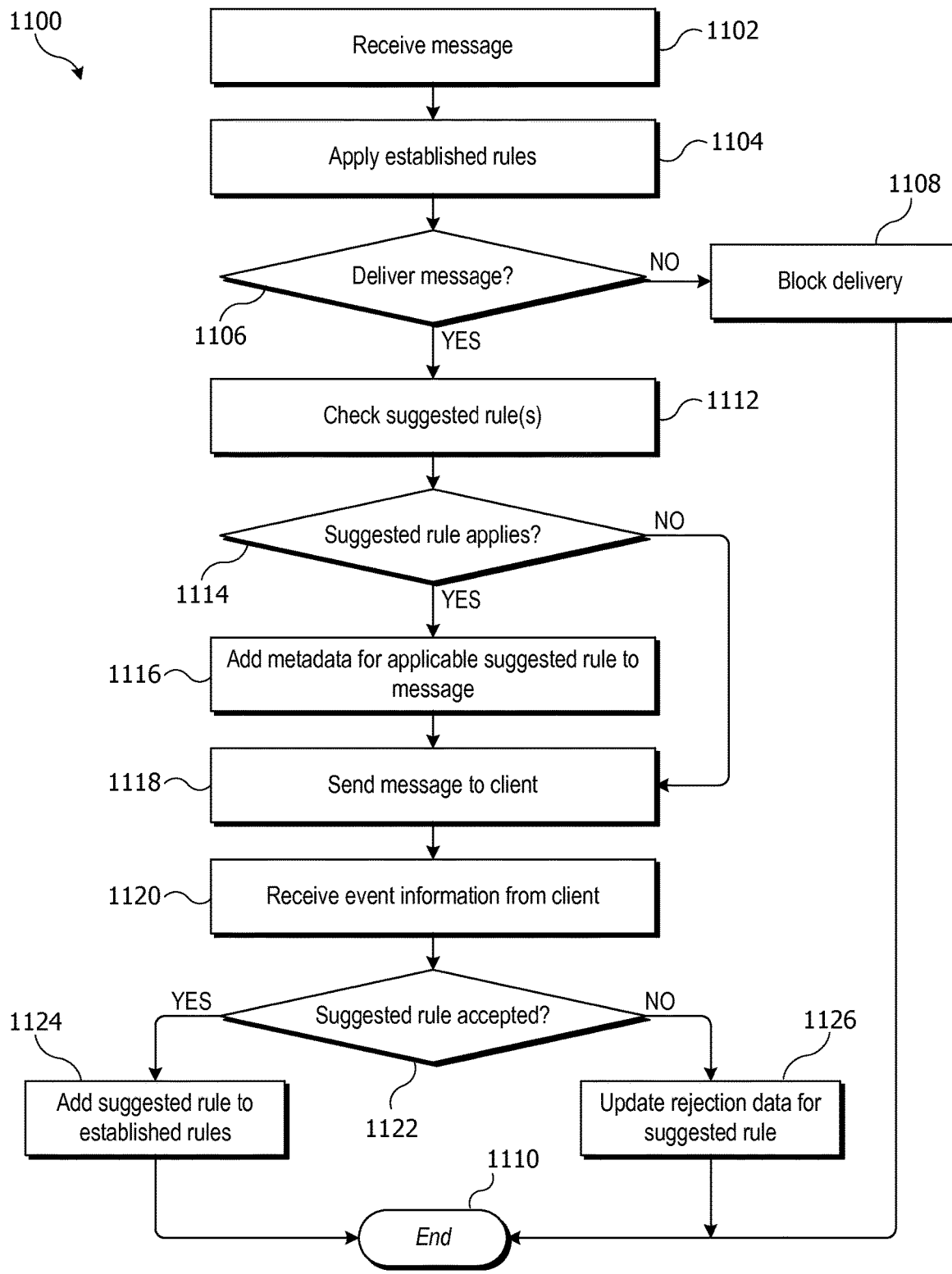
FIG. 11 shows a flow diagram of a process for applying filtering rules to a message according to an embodiment of the present invention.

Before establishing a suggested rule, message management service 200 can provide the rule to a client and obtain user confirmation that the rule should be established. FIG. 11 shows a flow diagram of a process 1100 for applying filtering rules to a message according to an embodiment of the present invention. Process 1100 can be implemented, e.g., in filtering module 234 of message management service 200 of FIG. 2.

At block 1102, filtering module 234 can receive an inbound message originating from a messaging service (e.g., messaging service 204a of FIG. 2). This can be a new message that has not previously been delivered to a client, acted upon by the recipient user, or processed (e.g., deferred) by message management service 200.

At block 1104, filtering module 234 can apply any established filtering rules (e.g., rules 240 of FIG. 2) to the new message. In some embodiments, when a new user account is created at message management service 200, the set of established filtering rules can initially be empty. Alternatively, the set of rules can be pre-populated with a starting set of rules, which might include, e.g., spam-filtering rules and/or rules selected based on user demographics. Applying established rules at block 1104 can include determining whether the message satisfies the triggering condition for an established rule and, if so, automatically performing the resulting action. For example, if an established rule indicates that the message should be automatically deferred, moved to a folder or list, or deleted, the indicated action can be performed. Filtering module 234 or another component of message management service 200 can generate and send appropriate update instructions to the source messaging service (e.g., messaging service 204a) from which the message was received and/or update its own internal state to perform the action. In some embodiments, performing an action in response to a rule can be implemented identically to performing the same action in response to event information received from the client, with the only difference being that the action is initiated by filtering module 234 rather than in response to a communication from the client.

At block 1106, filtering module 234 can determine, based on the results of applying the established rules, whether the inbound message should be delivered to the client as a new received message. If not, then delivery can be blocked at block 1108. For instance, if applying the established rules results in moving the message to another folder (out of the inbox), deferring it, or deleting it, then the message should not be delivered to the client as a new received message. If delivery is blocked, process 1100 can end (block 1110).

It should be understood that even if block 1106 results in a determination not to deliver the message at this point, the message may nevertheless be delivered at some later time. For example, if a message is deferred by application of an established rule, the deferred message can be delivered to the client at a later time, when a deferral-ending condition is met. As another example, if application of the rule results in moving the message to a list or folder, the message can be delivered when the user next accesses that list or folder.

If at block 1106, it is determined that the message should be delivered, then at block 1112, filtering module 234 can determine whether any suggested rules apply to the message. In some embodiments, suggested rules can be provided by pattern detector 238, e.g., as a result of executing process 1000 of FIG. 10. At block 1114, if a suggested rule applies to the message, then at block 1116, filtering module 234 can add suggestion metadata to the message. The suggestion metadata can describe the applicable suggested rule. For example, as described above, a rule can be expressed as a resulting action to be taken when a triggering condition is satisfied. Accordingly, the suggestion metadata can identify the resulting action and the triggering condition (e.g., the specific message features and/or context elements used to determine whether the triggering condition is satisfied). At block 1118, the message can be delivered to the client. As shown, the message can be delivered regardless of whether a suggested rule applies; however, suggestion metadata is added only if a suggested rule applies.

In some embodiments, it is possible for multiple suggested rules to apply to the same message. Where this is the case, filter module 234 can select one of the suggested rules and provide suggestion metadata only for the selected rule. For example, in some implementations of process 1000, pattern detector 238 can assign a score to each suggested rule based on the strength of the detected correlation, and filter module 234 can select the suggested rule that has the highest score. (If the highest score is shared by two or more suggested rules, a random selection among them can be made.) In other embodiments, filter module 234 can add suggestion metadata for multiple suggested rules to a single message.

At block 1120, process 1100 can receive event information from the client. The event information can include an indicator of a user action performed on the message and can also include an indicator as to how the user responded to the suggested rule. For example, referring to FIG. 4C, the event information can indicate whether the user selected "Yes" button 444 (accepting the rule) or any of "No" button 446, "Ask me later" button 448, or "Close" button 450 (all of which correspond to various forms of not accepting the rule). At block 1122, if the user accepted the suggested rule, then at block 1124, the suggested rule can be added to the set of established rules, and process 1100 can end (block 1110). If, at block 1122, the user did not accept the suggested rule, then at block 1126, process 1100 can update rejection data for the suggested rule, after which process 1100 can end (block 1110).

Figure 12:
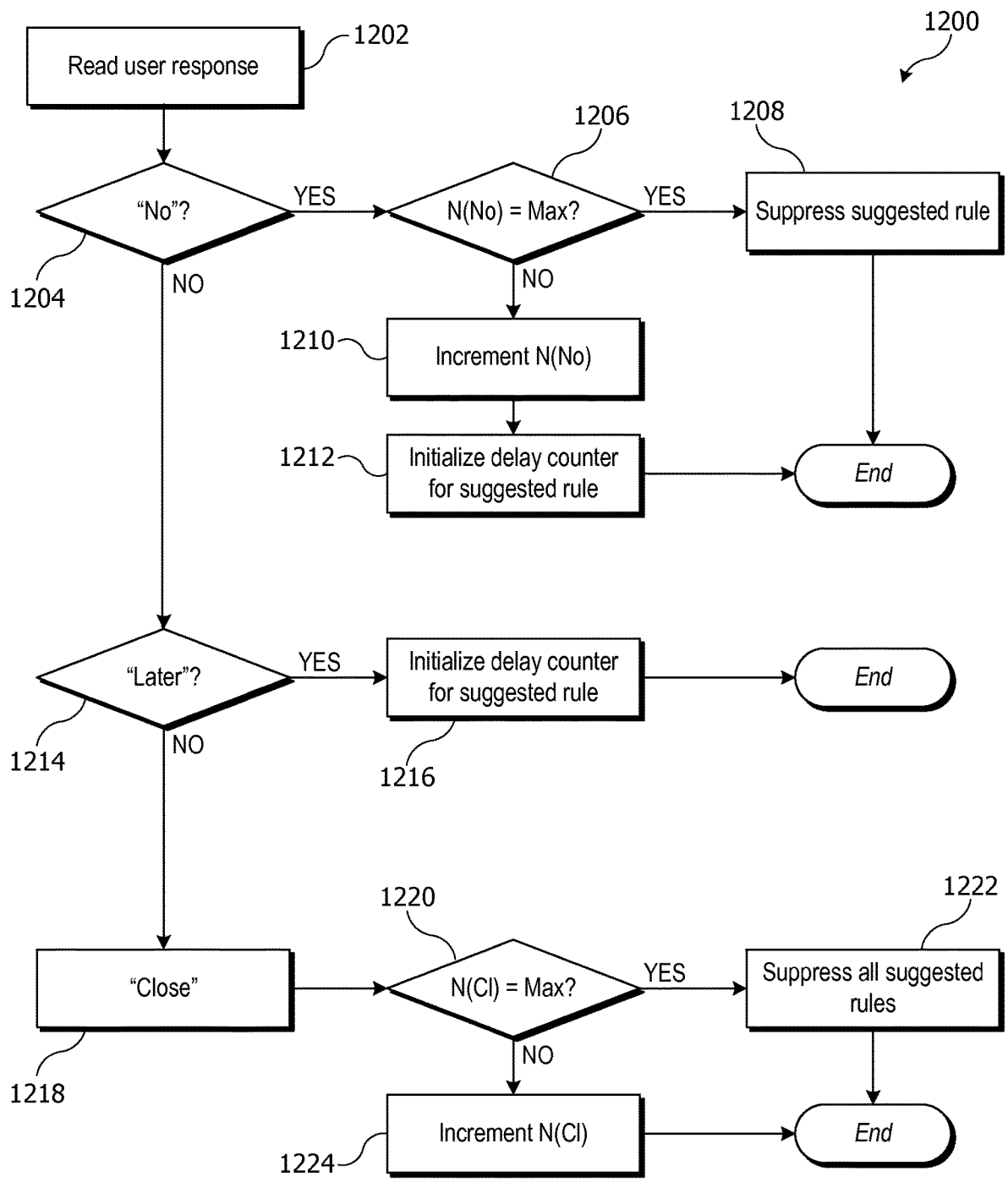
FIG. 12 shows a flow diagram of a process for updating rejection data according to an embodiment of the present invention.

Rejection data can be used in some embodiments to determine whether and when to present a suggested rule again after a user did not accept it. FIG. 12 shows a flow diagram of a process 1200 for updating rejection data according to an embodiment of the present invention. Process 1200 can be implemented, e.g., in filter module 234 of message management service 200, and can be used, e.g., at block 1126 of process 1100 described above.

At block 1202, a user response to a suggested rule can be read. In this example, it is assumed that menu 440 of FIG. 4C was presented and the user made a selection. In the case where "Yes" button 444 is selected, the rule is accepted and process 1200 would not be invoked. The other cases can be handled in the manner shown in FIG. 12.

For instance, at block 1204, if the user responded "No" (e.g., by selecting "No" button 446 in FIG. 4C), this can be taken as an indication that the user probably does not want to implement the suggested rule, at least not at the present time. Accordingly, it may be desirable to temporarily or permanently suppress the suggested rule from being presented again. In some embodiments, a counter "N(No)" is maintained for each suggested rule to count the number of times the user responds "No." If, at block 1206, the counter has reached a maximum value (e.g., 2 or 3 or some other number), then at block 1208, the suggested rule can be suppressed. For example, filter module 234 can maintain a list of suppressed rules. Whenever pattern detector 238 provides a suggested rule, filter module 234 can compare the suggested rule to the list of suppressed rules and ignore the suggested rule if it matches a suppressed rule. In some embodiments, filter module 234 can provide feedback about suppressed rules to pattern detector 238, and pattern detector 238 can incorporate this feedback into subsequent processing.

If, at block 1206, counter N(No) has not reached its maximum value, then at block 1210, counter N(No) can be incremented. To prevent the suggested rule from being presented to the user again too soon (which can be annoying to the user), at block 1212 a delay counter for the suggested rule can be initialized. In some embodiments, the delay counter can be based on time; for example, a suggested rule to which the user responds "No" is not presented again for at least 24 hours. In other embodiments, the delay counter can be based on a number of messages to which the suggested rule applies; for example, a suggested rule to which the user responds "No" is not presented again until the user has acted on at least three more messages (or some other number) to which the suggested rule applies. In either case, filter module 234 can continue to process new inbound messages in accordance with process 1100 described above, except that a suggested rule for which a delay counter is active can be treated as not applying at block 1114, until such time as the delay counter reaches its limit (e.g., the delay time expires or the relevant number of messages is reached). It should be understood that while a delay counter is active for one suggested rule, other suggested rules can be presented, e.g., through operation of process 1100.

If, at block 1204, the user did not respond "No," process 1200 can proceed to block 1214. If the user responds "Later" (e.g., by selecting "Ask me later" button 448 in FIG. 4C), then at block 1216, a delay counter for the suggested rule can be initialized. This can be similar to the delay counter described above with reference to block 1212, although the delay period can be different. For instance, the delay period can be shorter for a "Later" response than for a "No" response. In some embodiments, the delay period for a "Later" response can be, in effect, zero; that is, the suggested rule can be presented again the next time message management service 200 receives a new incoming message to which it applies. When the user responds "Later," it is assumed for purposes of process 1200 that the user might nevertheless be interested, so unlike the "No" case, a "Later" response does not result in suppressing the suggested rule.

If, at block 1214, the user did not respond "Later," process 1200 can proceed to block 1218. This corresponds to the case where the user closed the prompt without a specific response (e.g., by selecting "Close" button 450 in FIG. 4C). Here, the user's intent is ambiguous, as this response may indicate that the user just doesn't want to read the prompt at this time or it may indicate that the user is generally uninterested in receiving suggested filtering rules. The intent can be more accurately inferred from a pattern: if the user repeatedly selects "Close," that may suggest a lack of interest. Accordingly, in some embodiments, filter module 234 can maintain a global counter of "Close" responses ("N(Cl)"). If, at block 1220, this counter N(Cl) reaches a maximum value (e.g., 3, 5, or some other number), then at block 1222, filter module 234 can suppress all suggested rules. For example, referring to FIG. 11, filter module 234 can skip blocks 1114 and 1116 of process 1100. If, at block 1220, counter N(Cl) has not reached its maximum value, then at block 1224, counter N(Cl) can be incremented. In some embodiments, any user response other than "Close" resets counter N(Cl), so that global suppression of suggested rules at block 1222 occurs only if the user never responds with anything other than "Close." In other embodiments, a "Close" response can be ignored by message management service 200, so that such a response has no effect on subsequent behavior (e.g., whether rules are suggested).

Where a particular suggested rule is suppressed (e.g., as a result of block 1208), or where all suggested rules are suppressed (e.g., as a result of block 1222), the suppression can be but need not be permanent. For example, suppression can last for a fixed period of time (e.g., a week or a month) before message management service 200 begins again to suggest filtering rules. Where suggested rules are temporarily suppressed, pattern detector 238 can continue to operate so that when suggested rules become unsuppressed, filter module 234 has a current set of suggested rules that can be presented to the user.

Figure 13:
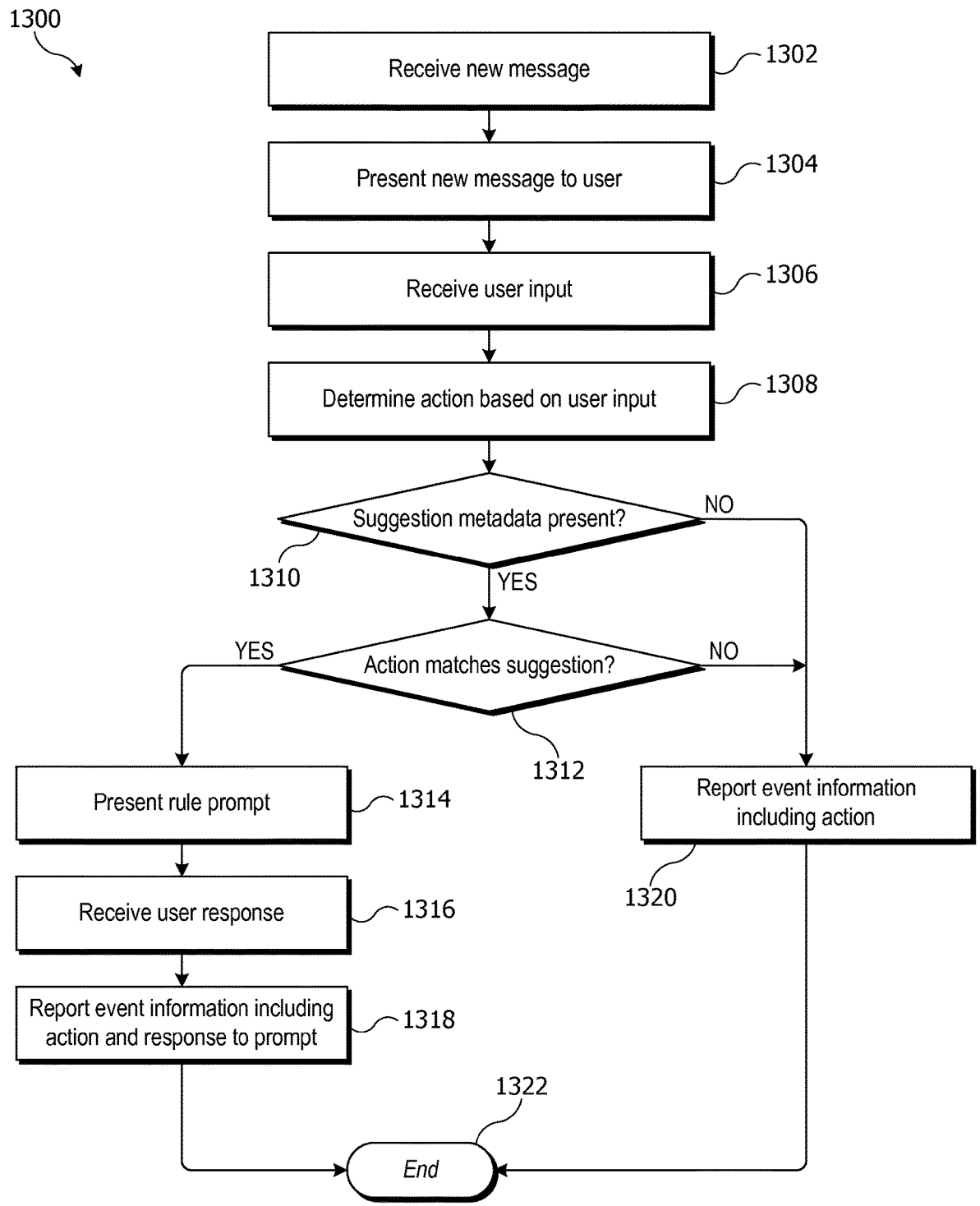
FIG. 13 is a flow diagram of a process for presenting suggested rules to a user according to an embodiment of the present invention.

As described above, suggested rules can be presented to a user by a client, allowing the user to decide whether they should become established rules. Examples of processes that can be used by client devices to present suggested rules will now be described. FIG. 13 is a flow diagram of a process 1300 for presenting suggested rules to a user according to an embodiment of the present invention. Process 1300 can be implemented, e.g., in client 202 (or client 108 or 110 of FIG. 1) with a user interface similar to the user interface of FIGS. 4A-4C.

Process 1300 can begin at block 1302, when client 202 receives a new message, for example as a result of message management service 200 executing block 1118 of process 1100 described above. At block 1304, client 202 can present the message to the user, e.g., in a message list such as message list 402 of FIG. 4A. At block 1306, client 202 can receive user input relating to the message, and at block 1308, client 202 can interpret the user input to determine the indicated action. For example, as shown in FIG. 4B, the user input can indicate an action of deferring the message.

At block 1310, client 200 can determine whether the message acted upon has suggestion metadata (e.g., as a result of message management service 200 executing block 1116 of process 1100 described above). If so, then at block 1312, client 202 can determine whether the action indicated at block 1308 matches the resulting action specified in the suggestion metadata. If it does, then at block 1314, client 202 can present a prompt regarding the suggested rule to the user. This prompt can be similar to prompt overlay 440 of FIG. 4C. At block 1316, client 200 can receive user input responsive to the prompt (e.g., selecting "Yes," "No," "Ask me later", or "Close"). At block 1318, client 202 can report the event to message management service 200. The report can include the action taken on the message (as determined at block 1308) and the response to the prompt (as received at block 1316).

If suggestion metadata is not present at block 1310 or if block 1312 results in a determination that the user action does not match the resulting action of the suggested rule, then at block 1320, client 202 can report the event to message management service 200. In this instance, since a prompt related to the suggested rule was not presented, the report does not include a user response to the prompt. In some embodiments, the report at block 1320 can indicate whether there was a suggested rule and an action that did not match the suggested rule or whether there was no suggested rule; in other embodiments, this information is already available at message management service 200 and the client need not report it. The report at block 1320 can also include other information, such as whether the user opened the message before selecting an action and, if so, how long the message was open.

After reporting at block 1318 or 1320, process 1300 can end at block 1322. The action taken by the user can be incorporated into an event record and subsequently used by pattern detector 238 to generate future suggested rules. Further, if the event information indicates that the user accepted a suggested rule, the suggested rule can be added to the set of established rules as described above.

Process 1300 or portions thereof can be repeated as new messages are received. For example, as each new message is received, the message list presented to the user can be updated. Users can interact with messages in any order, not necessarily corresponding to the order in which messages are received, and blocks 1306-1320 can be performed with regard to a particular message whenever the user happens to act on that message.

Figure 14:
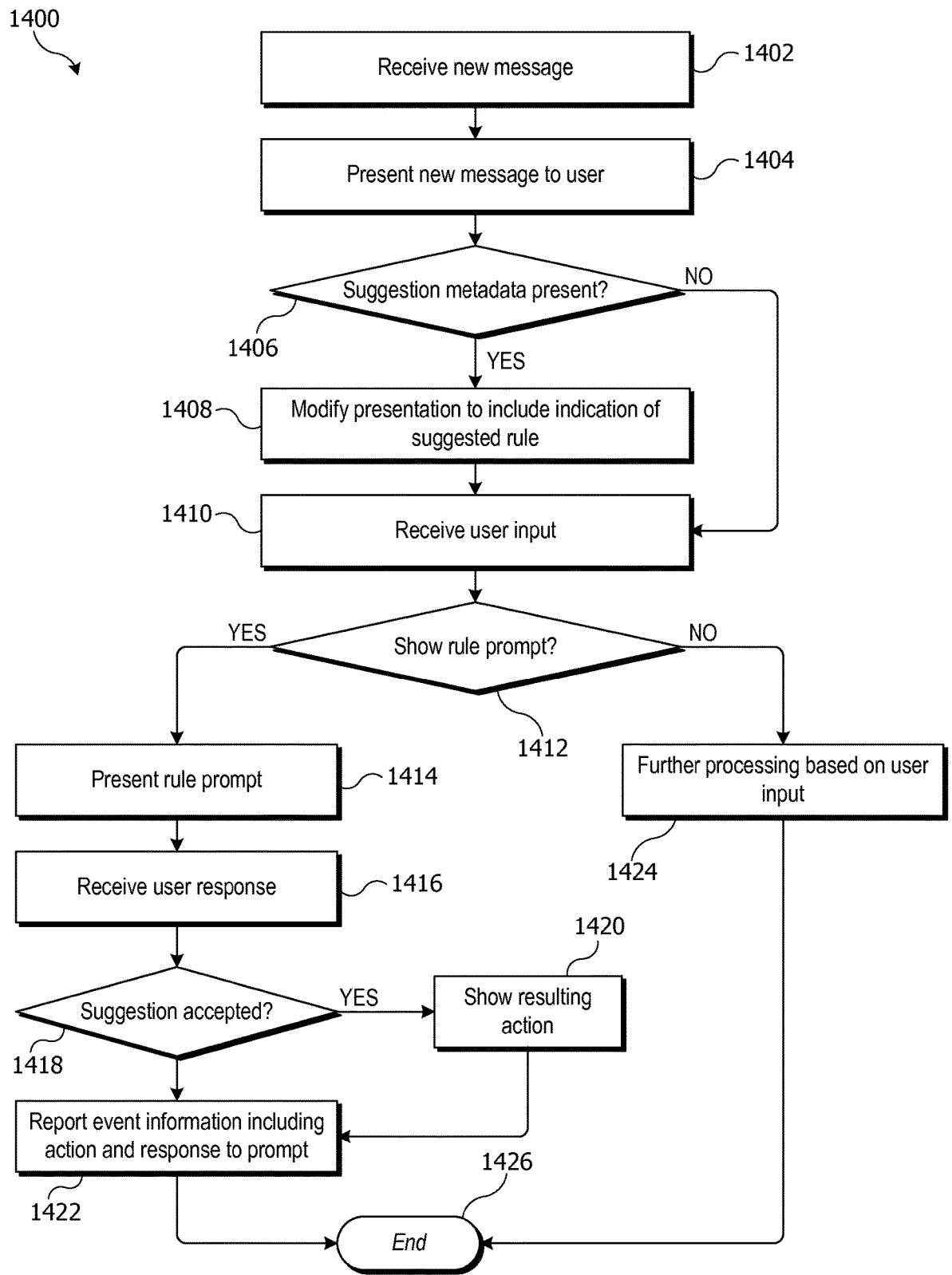
FIG. 14 is a flow diagram of another process for presenting suggested rules to a user according to an embodiment of the present invention.

FIG. 14 is a flow diagram of another process 1400 for presenting suggested rules to a user according to an embodiment of the present invention. Process 1400 can be implemented, e.g., in client 202 (or client 108 or 110 of FIG. 1) with a user interface similar to the user interface of FIGS. 5A-5C.

Process 1400 can begin at block 1402, when client 202 receives a new message, for example as a result of message management service 200 executing block 1418 of process 1400 described above. At block 1404, client 202 can present the message to the user, e.g., in a message list such as message list 502 of FIG. 5A. If, at block 1406, the message has suggestion metadata (e.g., as a result of message management service 200 executing block 1416 of process 1400 described above), then at block 1408, client 202 can modify the presentation to include an indication of the suggested rule. For example, as shown in FIG. 5A, underlining can be used to indicate the triggering condition (e.g., by underlining the portion of the message corresponding to the triggering condition) and/or the resulting action (e.g., by color or line style of the underline).

At block 1410, client 202 can receive user input relating to the message. For example, referring to FIG. 5A, the user input can include tapping on the message or on the modified portion of the message.

At block 1412, client 202 can determine whether the user input indicates that a prompt to accept the rule should be shown. For example, as described above, tapping on the message may indicate that the prompt should be shown while other actions (e.g., swiping the message) may indicate that the prompt should not be shown. If the prompt should be shown, then at block 1414, client 202 can present a prompt regarding the suggested rule to the user. This prompt can be similar to prompt 530 of FIG. 5B. At block 1416, client 200 can receive user input responsive to the prompt (e.g., tapping on prompt 530 to accept the suggestion or taping elsewhere on the screen to decline). At block 1418, client 200 can determine whether the user accepted the suggested rule. If so, then at block 1420, client 200 can show the resulting action via the user interface, e.g., by animating the action as shown in FIG. 5C. This can provide a confirmation that the suggested rule was accepted and that the resulting action is being applied to the message. Regardless of whether the suggested rule is accepted, at block 1422, client 202 can report the event to message management service 200. The report can include the response to the prompt (as received at block 1416) and/or an indicator of the action taken on the message.

If a rule prompt is not shown at block 1412 (e.g., because suggestion metadata is not present at block 1406), additional processing can occur at block 1424. For example, if the user input at block 1410 indicates some other action to be taken on the message, client 200 can report event information, including the action, to message management service 200. The report can indicate whether there was a suggested rule and an action that did not match the suggested rule or whether there was no suggested rule; in other embodiments, this information is already available at message management service 200 and the client need not report it. A report at block 1424 can also include other information, such as whether the user opened the message before selecting an action and, if so, how long the message was open.

After reporting at block 1422 or further processing at block 1424, process 1400 can end at block 1426. The action taken by the user can be incorporated into an event record and subsequently used by pattern detector 238 to generate future suggested rules. Further, if the event information indicates that the user accepted a suggested rule, the suggested rule can be added to the set of established rules as described above.

Process 1400 or portions thereof can be repeated as new messages are received. For example, as each new message is received, the message list presented to the user can be updated. Users can interact with messages in any order, not necessarily corresponding to the order in which messages are received, and blocks 1410-1422 can be performed with regard to a particular message whenever the user happens to act on that message.

Figure 15:
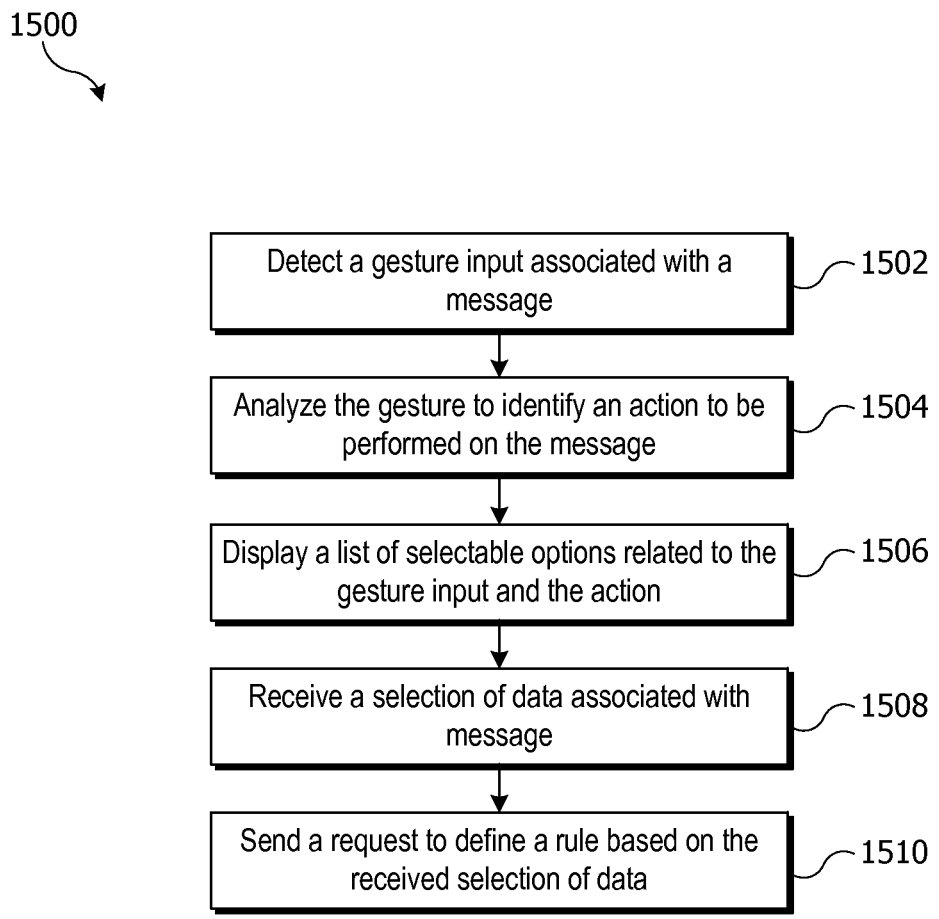
FIG. 15 shows a flow diagram of a process for gesture-based filter generation according to an embodiment of the present invention.

FIG. 15 shows a flow diagram 1500 of a process for gesture-based rule generation according to an embodiment of the present invention. At block 1502, a gesture input corresponding to an action to be performed on at least one message for a user is detected at a message management service. As described above, the gesture may be a compound gesture that includes multiple sub-gestures. One example of a compound gesture is a swipe and hold gesture which includes a transverse portion (e.g., an initial contact point with the user interface, the contact is then dragged in a particular direction to a second point) and a hold portion (e.g., the contact is held substantially at the second point for a particular period of time).

At block 1504 the gesture input is analyzed to identify the action to be performed. As described above, the action may include generating a rule related to archiving, deleting, deferring, or adding the message to a list. In some embodiments, gestures may be used with other content items (such as images, videos, documents, or other content items), and may be associated with content item-specific actions (such as sharing or hiding the content items). Different portions of the compound gesture can be associated with different actions. For example, a first set of actions can be associated with the transverse portion and a second set of actions can be associated with the hold portion. The different sets of actions can be related to one another, for example the first set of actions can include instructions to archive, delete, or defer a message and the second set of actions can include an instruction to create a rule that performs the action automatically on subsequent messages. In some embodiments, the actions associated with a gesture can be identified based on gesture definitions. For example, a length and direction associated with the transverse portion can be matched to a gesture definition (e.g., a vector).

In some embodiments, the action associated with a compound gesture can be determined based on a time associated with the hold portion of the compound gesture. The time can be compared to a threshold value. If the time is less than the threshold then the action can be selected from the first set of actions and if the time is greater than the threshold the action to be performed can be selected from the second set of actions. In some embodiments, multiple thresholds can be associated with a hold gesture, enabling multiple actions to be selected by varying the length of the hold portion.

At block 1506, the message management service can display a list of selectable options related to the detected gesture and the identified action. As described above, the prompt can request a selection of senders, conversations, recipients or other data such as a deferral time or a name of a list. At block 1508, the message management service can receive a selection of data associated with the message. At block 1510, the message management service can send the selection of data associated with the message to the message management service to define a rule. As described above, the rule may then be added to filtering rules 240, and applied to subsequently received messages that share the selection of data used to define the rule at block 1510.

In some embodiments, once the rule has been defined it can be applied to subsequent incoming messages (e.g., through filter 234). When message management service receives subsequent message, filter 234 can apply the new rule to the message and perform the corresponding action to the message (e.g., automatically archive, delete, move, and/ or defer the message). This way, email rules can be quickly and intuitively defined even where a pattern has not been identified.

Process 1500 or portions thereof can be repeated as new messages are received. For example, as each new message is received, the message list presented to the user can be updated. Users can interact with messages in any order, not necessarily corresponding to the order in which messages are received, and blocks 1502-1510 can be performed with regard to a particular message whenever the user happens to act on that message.

Figure 16:
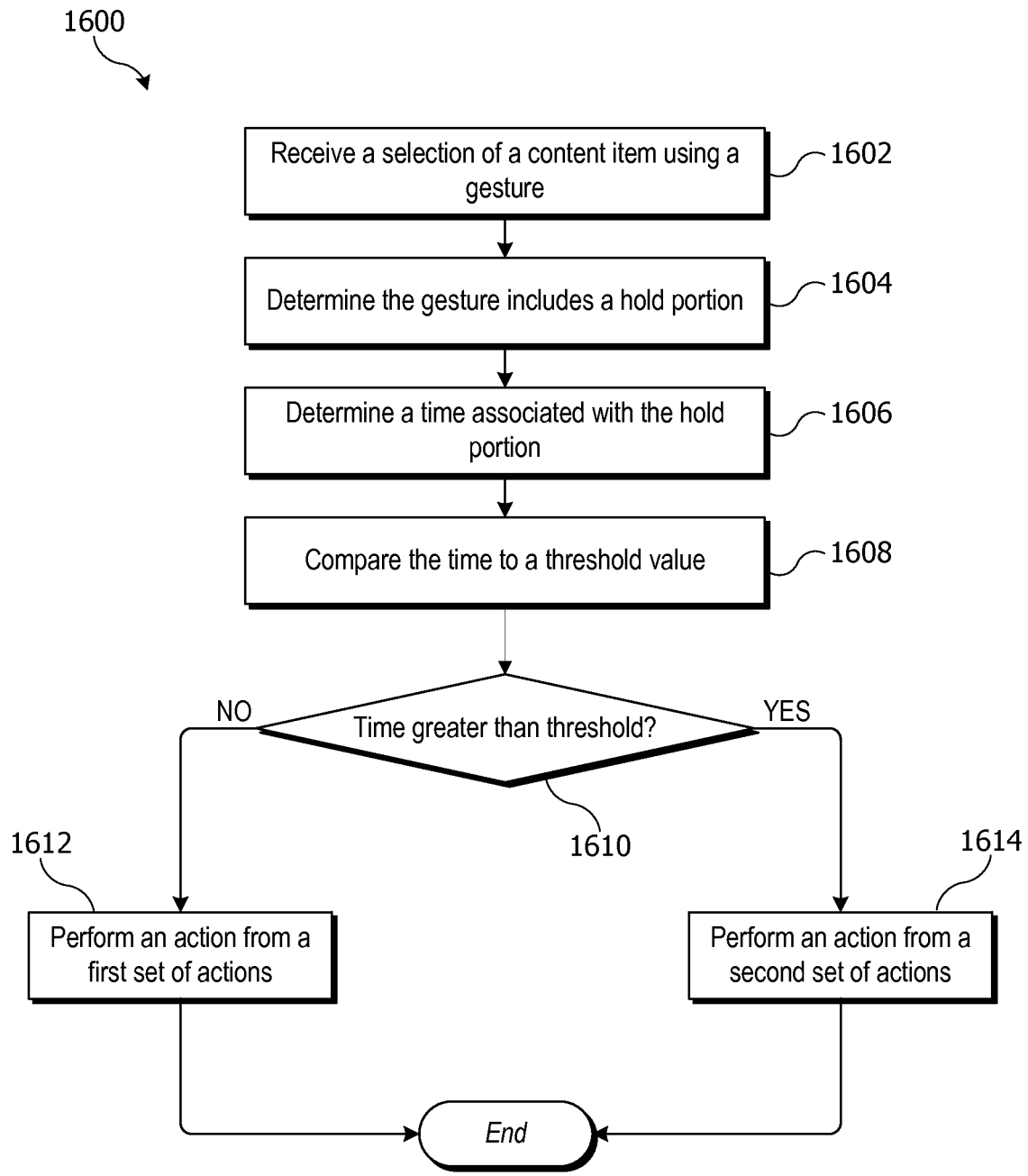
FIG. 16 shows a flow diagram of a process for identifying an action associated with a gesture-based input according to an embodiment of the present invention.

FIG. 16 shows a flow diagram 1600 of a process for identifying an action associated with a gesture-based input according to an embodiment of the present invention. At step 1602, a selection of a content item can be received using a gesture. For example, as described above, the user can swipe or swipe and hold a content item. The gesture can be analyzed to identify one or more actions to be performed on the selected content item. For example, at step 1604, it can be determined whether the gesture includes a hold portion. The gesture can be analyzed by input analyzer 246 on client device 202. In some embodiments, input data can be received and analyzed by message management service 200 directly.

At step 1606, a time period associated with the hold portion can be determined. The time period can correspond to how long contact is maintained at substantially the same position on client 202. At step 1608, the time period can be compared to one or more threshold values associated with the hold portion. In some embodiments, the threshold values associated with the hold portion can be determined based on a preceding portion of the gesture.

At step 1610, if the time period is less than the threshold, then processing can proceed to step 1612 and an action from the first set of actions can be performed. If the time period is greater than the threshold, then processing can proceed to 1614 and an action from the second set of actions can be performed. As described above, the actions from each set of actions can be related. For example, if the first set of actions include archiving, moving, or deleting the content item, the second set of actions can include creating a rule based on the first set of actions for subsequent or similar content items. The first set of actions can be determined based on a portion of the gesture preceding the hold portion. For example, a preceding transverse portion (e.g., a swipe) can select from various actions depending on the direction and distance traversed by the transverse portion.

Process 1600 or portions thereof can be repeated as new messages are received and/or as content items are uploaded or updated. For example, as each new content item is received, the content items presented to the user can be updated. Users can interact with content items in any order, not necessarily corresponding to the order in which content items are made available, and blocks 1602-1614 can be performed with regard to a particular content item whenever the user happens to act on that content item.

It will be appreciated that the processes described herein are illustrative and that variations and modifications are possible. Steps described as sequential may be executed in parallel, order of steps may be varied, and steps may be modified, combined, added or omitted. Processes 900, 1000, 1100, 1200, 1300, 1400, 1500, and 1600 (or similar processes) can be used together to implement dynamic filtering, with rules being automatically suggested based on user behavior and the user ultimately determining whether a suggested rule should become an established rule. For example, process 900 can be repeated as new messages are delivered to and acted upon by clients (or users interacting with clients). Process 1000 can be repeated at regular intervals (e.g., after some minimum number of new actions have been reported) to update the set of suggested rules. Thus, a particular rule can become a suggested rule when a strong correlation is detected. If the user does not accept the rule, the rule can remain a suggestion for as long as the strong correlation continues to be detected. If the correlation weakens, then the suggested rule can be removed from the set of suggested rules by operation of process 1000. Process 1100 can be performed for each new message received by message management service 200, and process 1200 can be performed when the user does not accept a suggested rule. Process 1300 can be performed as new messages are received by a client and acted upon by the user.

Processes as described herein can provide uniform filtering behavior across multiple client devices. For example, event records data store 242 of FIG. 2 can collect events across all clients used by a particular user. Further, an established rule can be applied across all clients associated with the same user, so a user who has multiple clients need not spend time re-creating the same rules on each client.

In some instances, a user behavior pattern can be correlated with the particular client the user is operating. For instance, a user may review messages on her mobile phone (e.g., client 108 of FIG. 1) throughout the day and may keep deferring messages from her friends until such time as she is able to use her desktop computer (e.g., client 110 of FIG. 1) at home, at which time she reads and responds to them. In some embodiments, pattern detector 238 of FIG. 2 can detect this pattern and suggest a rule that defers messages from these senders until the next time the user is using client 110.

Some embodiments can also provide uniform filtering behavior across multiple messaging-service accounts. For example, as described above, message management service 200 can act as an intermediary for multiple messaging services 204a, 204b. User accounts with any number of messaging services 204 can be linked to a single user account with message management service 200. Where this is the case, message management service 200 can have access to information about user behavior in relation to messages from multiple messaging services. Accordingly, message management service 200 can detect correlations in user behavior across messages sourced from different messaging services and suggest filtering rules accordingly. In some instances, user behavior may be correlated with the source of the message; for instance, the user may treat messages received at her work email address differently from messages received at her personal email address. In some embodiments, pattern detector 238 can detect patterns that depend on the source of the messages, and the triggering conditions defined for some filtering rules can incorporate the message source while other rules can be independent of message source.

Further, some embodiments can also provide uniform filtering behavior across multiple types of messages. For example, as described above, message management service 200 can act as an intermediary for multiple messaging services 204a, 204b, and different messaging services 204a, 204b can provide the same type of messages (e.g., two different email service providers) or different types of messages (e.g., an email service provider and a social networking service provider). User accounts with any number of messaging services 204 (including services supporting different types of message) can be linked to a single user account with message management service 200. Where this is the case, message management service 200 can have access to information about user behavior in relation to different types of messages. Message management service 200 can construct a uniform message model to facilitate handling of different types of messages. For instance, each message can be modeled as a structured data object having fields such as message type (e.g., email, social-network message, text message, etc.); sender identifier (e.g., email address, phone number, name, etc.); recipient identifier (e.g., one or more email addresses, phone numbers, names, etc.); date and time sent; date and time received by the messaging service; subject (which can be blank for message types such as text messages that do not provide a subject field); and message body. Thus, messages of different type, including a wide variety of communications between individuals and/or among groups, can be analyzed together in the manner described above to identify feature sets that, when present, result in a consistent user action. Accordingly, message management service 200 can detect correlations in user behavior across different message types and suggest filtering rules accordingly. In some instances, user behavior may be correlated with the type of the message; for instance, the user may treat email messages differently from text messages or social-network messages. In some embodiments, pattern detector 238 can detect patterns that depend on the type of the messages, and the triggering conditions defined for some filtering rules can incorporate the message type while other rules can be independent of message type.

Processes such as those described above can allow filtering rules to be created with little or no user effort. For instance, the user does not need to access a rule-defining interface, fill in rule templates, or take other action explicitly aimed at defining a rule. Instead, the user can simply act on messages as she sees fit, and based on detected patterns in the user's actions, the message management service can identify and suggest rules that may help the user act on messages more efficiently. A suggested rule can be presented to the user in a context where she can appreciate its applicability (e.g., when she has just, in effect, applied the rule to a message, as described above), and the user can establish a rule by simply accepting the suggestion when it is presented. Further, in embodiments where suggested rules become established only after user approval, the user can avoid the unpleasant experience of having the message management service take action on its own that the user may not desire.

Those skilled in the art with access to the present disclosure will recognize that other modifications are possible. For instance, in some embodiments, suggested rules can be generated based on a specific set of user actions, such as moving, deferring, or archiving a message without first reading the message. In such embodiments, instances where the user read the message before acting on it can be ignored, e.g., by not generating event records for pattern detector 238 or by prefiltering to eliminate such event records (e.g., at block 1002 of process 1000). Whether a user read a message before acting on it can be determined heuristically by client 202 and reported to the message management service as part of the event information. For example, in some embodiments, a message can be considered unread if the user either acted on the message directly from an inbox message list (without first opening the message) or opened the message for less than a defined period of time (e.g., one second or less, or two seconds or less) prior to acting on it. The client can start a timer when a user opens a new message and deem the message read if the message remains open for longer than the defined period. The defined period can be selected as desired and can be based on observations of user behavior, such as how long it takes a user to read a typical message.

In some embodiments, generation of suggested rules can be extended to any user action on a message, provided that a consistent pattern of user action resulting from a triggering condition can be detected. For rules related to moving, deferring, or deleting messages, applying the rule might result in not delivering the message to the client (e.g., in examples described above). For other types of rules, a message to which the rule applies can be sent to the client together with action metadata indicating an action the client should take in connection with presenting the message to the user.

For example, if a user consistently forwards messages received from a particular sender to a particular destination, a rule can be defined that, for any message from the sender, the user should be prompted to forward it to the destination. Message management service 200 can send the message to client 202 together with action metadata indicating that the user should be prompted to forward the message and identifying the destination. When the user opens the message, client 202 can prompt the user to forward the message, e.g., by displaying a prompt asking whether the user wants to forward the message. If the user indicates that the message should be forwarded, client 202 can prepare the forwarded message and either automatically send it or present it to the user in case the user wants to modify the forwarded message before sending it. In some embodiments, if a user accepts a suggested rule to always forward messages meeting a triggering condition, the forwarding can be implemented within message management service 200, and the metadata sent to the client with the message can include an indication that the message has been forwarded by application of a rule. The client can so inform the user (e.g., when the user opens the message), so that the user knows there is no need to manually forward the message.

As another example, a user may consistently reply to messages from a particular sender (or set of senders) with messages that have certain features. For instance, the user may immediately reply to a message from her boss with a short message saying "confirmed," which may be followed by a substantive response at a later date. Or the user may repeatedly receive messages from her spouse saying "Going to the store, need anything?" with a list of items in bulleted form. In some embodiments, message management service 200 can analyze the replies to detect correlations between specific features in a reply message and features of the message being replied to. Where a correlation between triggering features of a received message and particular features (e.g., content and/or formatting) a reply message is detected, a rule can be defined that, for any message having the triggering features, the user should be prompted to reply with a message having the features that correlate with the triggering features. Message management service 200 can send the message to client 202 together with action metadata indicating that the user should be prompted to reply to the message. When the user opens the message, client 202 can prompt the user to reply to the message, e.g., by displaying a prompt asking whether the user wants to reply to the message. The prompt can indicate any features that would be automatically included in the reply if the user accepts the prompt. If the user accepts the prompt, client 202 can prepare the reply message incorporating the automatic features and either automatically send it or present it to the user in case the user wants to modify the reply message before sending it.

Triggering conditions and resulting actions can be defined with as much or as little complexity as desired. In some embodiments, a triggering condition can be based on presence or absence of one feature in a message (e.g., a particular sender, or particular words in the subject). In other embodiments, a triggering condition can incorporate a combination of message features. For instance, a set of "coupon-related" terms can be identified. Such terms can include single words such as "coupon" or "discount" or multi-word constructs such as "save [percentage]" or "[dollar amount] off." A triggering condition can be based on occurrence of one or more coupon-related terms in the message in combination with a particular sender, or on a combination of some minimum number of coupon-related terms (e.g., three or more such terms) in combination with the message being in a particular format (e.g., HTML).

Similarly, the complexity of resulting actions can be varied, and any action supported by message management service 200 can be a resulting action. For example, some message management services can offer the ability to defer a message (which can include temporarily removing the message from the user's inbox) until a deferral-ending condition occurs, at which time the message can be presented to the user (e.g., restored to the inbox). Where rules are defined to defer a message, the deferral-ending condition can be defined based on various criteria. Examples above make reference to temporal criteria, such as deferring the message until the evening or weekend. Message management service 200 can detect whether such criteria are met by reference to an internal and/or external clock. Other rules can use criteria based on detection of a particular user (or client) context rather than a particular time. For example, a rule can defer a message until the user (or the client) is at a particular location, such as at home or at the office. In some embodiments, the message management service can receive location information from the client and use the location information to determine whether a location-based condition has occurred. As another example, a rule can defer a message until the user is operating a particular client device (e.g., desktop computer rather than mobile phone); the message management service can detect activity on a particular client and use client identifying information to determine whether a client-specific condition has occurred. As yet another example, a rule can defer a message until the user is "free," which can be determined, for example, based on the user's calendar data. In some embodiments, the client can provide calendar data or a "free/busy" indicator derived from calendar data to the message management service, which can use the data to determine whether the user is free. A rule can defer a message until the user is in proximity to a particular other person or device. In some embodiments, the client can report detected devices in the vicinity (e.g., other devices on the same Wi-Fi network), and the message management service can use such reports to determine whether the deferral-ending condition has occurred. Alternatively, the message management service can communicate with multiple client devices and receive location reports from each client device; proximity of two client devices can be determined based on the location reports without the client devices communicating with or otherwise being aware of each other.

In some embodiments, a resulting action can be defined based partly or entirely on characteristics of the message, and the resulting action can be an action the user might prefer to the action she repeatedly takes. For example, a user may be subscribed to a newsletter or some other subscription-based service whose issues or other content are sent as messages to a group of recipients on a periodic basis, and the sender may include instructions in each message (or issue) indicating how to unsubscribe, e.g., a line at the end of the message providing an address for unsubscribe requests. Message management service 200 can detect a pattern in which the user consistently deletes newsletter messages for a particular subscription without reading them. The pattern can be detected based on sender, subject, recipient list, formatting, and/or other characteristics that may be consistent across issues of a newsletter that are sent as messages. In some embodiments, message management service 200 can suggest a rule to automatically delete future issues. In other embodiments, message management service 200 can detect that the messages that would be deleted by the rule provide unsubscribe instructions and can prompt the user to unsubscribe from the newsletter rather than just deleting the messages. If the user accepts the prompt, message management service 200 can automatically generate a request to unsubscribe based on the instructions in the messages. In some embodiments, further user interaction may be incorporated into the unsubscribe process, such as verifying a message to be sent or confirming the request at a website. As another example, in some embodiments, message management service 200 can detect a pattern in the user's unsubscribing behavior (e.g., the user consistently sends unsubscribe messages in response to newsletter-type messages having certain features) and can create a rule to suggest unsubscribing from other newsletter-type messages having those features. When the rule applies, message management service 200 can send the message to client 202 together with action metadata indicating that the user should be prompted to unsubscribe.

User interfaces described herein can also be modified. In some embodiments, additional user interface features can be implemented. For example, a user operating a client device may be able to manually define a rule instead of relying exclusively on suggestions from the message management service. In one embodiment, a user making a gesture to move a message (e.g., as shown in FIG. 4B) can hold the gesture at the final state for an extended period (e.g., 1 second, 2 seconds, or the like) to indicate that the gesture should be applied as a rule. Holding the gesture can result in the client displaying a dialog box to confirm that the rule should be established (similarly to FIG. 4C or FIG. 5B). If the user confirms, the client can send a description of the new rule to the message management service, allowing the rule to be applied across all the user's client devices and messaging accounts.

In some embodiments, a user interface can include a settings page or the like that the user can access to define, modify, or remove rules. For example, one settings page can present a list of currently established rules, which the client can obtain by requesting the information from the message management service. The list can provide options (e.g., buttons or gestures) that the user can select to edit or delete a rule. As another example, another settings page can present a list of suggested rules that have been generated by the message management service (e.g., as described above) but not yet accepted or declined by the user, and the user can accept or decline suggested rules by interacting with the list. As yet another example, a settings page can provide options to enable or disable rule suggestion features or to otherwise customize the behavior of suggestion generation.

Figure 17:
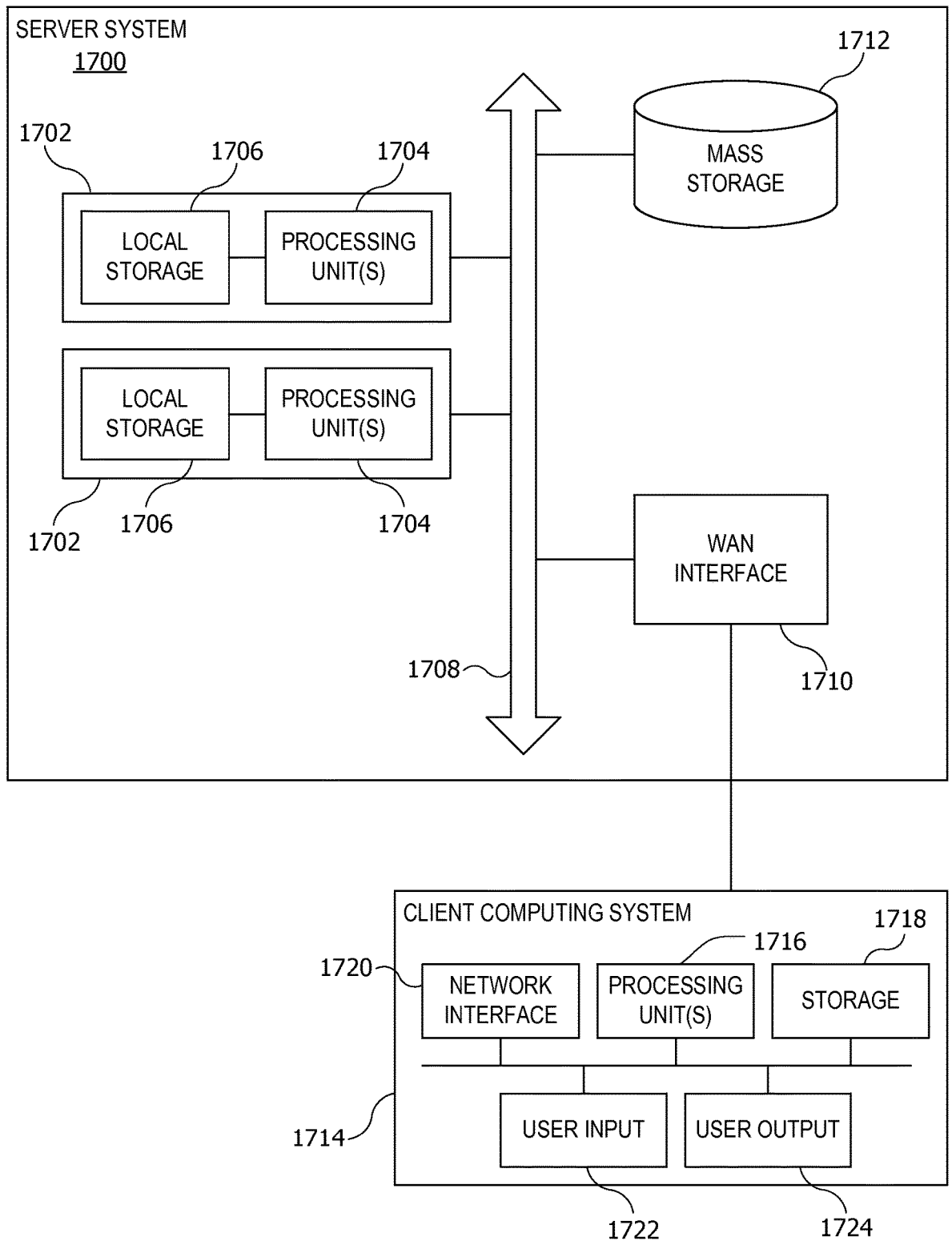
FIG. 17 shows a simplified block diagram of a representative server system and client computer system usable to implement certain embodiments of the present invention.

Various operations described herein can be implemented on computer systems, which can be of generally conventional design. FIG. 17 shows a simplified block diagram of a representative server system 1700 and client computer system 1714 usable to implement certain embodiments of the present invention. In various embodiments, server system 1700 or similar systems can implement message management service 200, messaging services 204, or any other services or servers described herein or portions thereof. Client computer system 1714 or similar systems can implement client device 202 or other clients described herein.

Server system 1700 can have a modular design that incorporates a number of modules 1702 (e.g., blades in a blade server implementation); while two modules 1702 are shown, any number can be provided. Each module 1702 can include processing unit(s) 1704 and local storage 1706.

Processing unit(s) 1704 can include a single processor, which can have one or more cores, or multiple processors. In some embodiments, processing unit(s) 1704 can include a general-purpose primary processor as well as one or more special-purpose co-processors such as graphics processors, digital signal processors, or the like. In some embodiments, some or all processing units 1704 can be implemented using customized circuits, such as application specific integrated circuits (ASICs) or field programmable gate arrays (FPGAs). In some embodiments, such integrated circuits execute instructions that are stored on the circuit itself. In other embodiments, processing unit(s) 1704 can execute instructions stored in local storage 1706. Any type of processors in any combination can be included in processing unit(s) 1704.

Local storage 1706 can include volatile storage media (e.g., conventional DRAM, SRAM, SDRAM, or the like) and/or non-volatile storage media (e.g., magnetic or optical disk, flash memory, or the like). Storage media incorporated in local storage 1706 can be fixed, removable or upgradeable as desired. Local storage 1706 can be physically or logically divided into various subunits such as a system memory, a read-only memory (ROM), and a permanent storage device. The system memory can be a read-and-write memory device or a volatile read-and-write memory, such as dynamic random access memory. The system memory can store some or all of the instructions and data that processing unit(s) 1704 need at runtime. The ROM can store static data and instructions that are needed by processing unit(s) 1704. The permanent storage device can be a non-volatile read-and-write memory device that can store instructions and data even when module 1702 is powered down. The term "storage medium" as used herein includes any medium in which data can be stored indefinitely (subject to overwriting, electrical disturbance, power loss, or the like) and does not include carrier waves and transitory electronic signals propagating wirelessly or over wired connections.

In some embodiments, local storage 1706 can store one or more software programs to be executed by processing unit(s) 1704, such as an operating system and/or programs implementing various server functions such as functions of message management modules 212, messaging service interface 214, and/or client interface 210 of FIG. 2, or any other server(s) associated with messaging system 100 of FIG. 1. "Software" refers generally to sequences of instructions that, when executed by processing unit(s) 1704 cause server system 1700 (or portions thereof) to perform various operations, thus defining one or more specific machine implementations that execute and perform the operations of the software programs. The instructions can be stored as firmware residing in read-only memory and/or program code stored in non-volatile storage media that can be read into volatile working memory for execution by processing unit(s) 1704. Software can be implemented as a single program or a collection of separate programs or program modules that interact as desired. From local storage 1706 (or non-local storage described below), processing unit(s) 1704 can retrieve program instructions to execute and data to process in order to execute various operations described above.

In some server systems 1700, multiple modules 1702 can be interconnected via a bus or other interconnect 1708, forming a local area network that supports communication between modules 1702 and other components of server system 1700. Interconnect 1708 can be implemented using various technologies including server racks, hubs, routers, etc.

A wide area network (WAN) interface 1710 can provide data communication capability between the local area network (interconnect 1708) and a larger network, such as the Internet. Conventional or other communications technologies can be used, including wired (e.g., Ethernet, IEEE 802.3 standards) and/or wireless technologies (e.g., Wi-Fi, IEEE 802.11 standards).

In some embodiments, local storage 1706 is intended to provide working memory for processing unit(s) 1704, providing fast access to programs and/or data to be processed while reducing traffic on interconnect 1708. Storage for larger quantities of data can be provided on the local area network by one or more mass storage subsystems 1712 that can be connected to interconnect 1708. Mass storage subsystem 1712 can be based on magnetic, optical, semiconductor, or other data storage media. Direct attached storage, storage area networks, network-attached storage, and the like can be used. Any data stores or other collections of data described herein as being produced, consumed, or maintained by a service or server can be stored in mass storage subsystem 1712. In some embodiments, additional data storage resources may be accessible via WAN interface 1710 (potentially with increased latency).

Server system 1700 can operate in response to requests received via WAN interface 1710. For example, one of modules 1702 can implement a supervisory function and assign discrete tasks to other modules 1702 in response to received requests. Conventional work allocation techniques can be used. As requests are processed, results can be returned to the requester via WAN interface 1710. Such operation can generally be automated. Further, in some embodiments, WAN interface 1710 can connect multiple server systems 1700 to each other, providing scalable systems capable of managing high volumes of activity. Conventional or other techniques for managing server systems and server farms (collections of server systems that cooperate) can be used, including dynamic resource allocation and reallocation.

Server system 1700 can interact with various user-owned or user-operated devices via a wide-area network such as the Internet. An example of a user-operated device is shown in FIG. 17 as client computing system 1714. Client computing system 1714 can be implemented, for example, as a consumer device such as a smart phone, other mobile phone, tablet computer, wearable computing device (e.g., smart watch, eyeglasses), desktop computer, laptop computer, and so on.

For example, client computing system 1714 can communicate via WAN interface 1710. Client computing system 1714 can include conventional computer components such as processing unit(s) 1716, storage device 1718, network interface 1720, user input device 1722, and user output device 1724. Client computing system 1714 can be a computing device implemented in a variety of form factors, such as a desktop computer, laptop computer, tablet computer, smart phone, other mobile computing device, wearable computing device, or the like.

Processor 1716 and storage device 1718 can be similar to processing unit(s) 1704 and local storage 1706 described above. Suitable devices can be selected based on the demands to be placed on client computing system 1714; for example, client computing system 1714 can be implemented as a "thin" client with limited processing capability or as a high-powered computing device. Client computing system 1714 can be provisioned with program code executable by processing unit(s) 1716 to enable various interactions with server system 1700 of a message management service such as accessing messages, performing actions on messages, and other interactions described above. Some client computing systems 1714 can also interact with a messaging service independently of the message management service.

Network interface 1720 can provide a connection to a wide area network (e.g., the Internet) to which WAN interface 1710 of server system 1700 is also connected. In various embodiments, network interface 1720 can include a wired interface (e.g., Ethernet) and/or a wireless interface implementing various RF data communication standards such as Wi-Fi, Bluetooth, or cellular data network standards (e.g., 3G, 4G, LTE, etc.).

User input device 1722 can include any device (or devices) via which a user can provide signals to client computing system 1714; client computing system 1714 can interpret the signals as indicative of particular user requests or information. In various embodiments, user input device 1722 can include any or all of a keyboard, touch pad, touch screen, mouse or other pointing device, scroll wheel, click wheel, dial, button, switch, keypad, microphone, and so on.

User output device 1724 can include any device via which client computing system 1714 can provide information to a user. For example, user output device 1724 can include a display to display images generated by or delivered to client computing system 1714. The display can incorporate various image generation technologies, e.g., a liquid crystal display (LCD), light-emitting diode (LED) including organic light-emitting diodes (OLED), projection system, cathode ray tube (CRT), or the like, together with supporting electronics (e.g., digital-to-analog or analog-to-digital converters, signal processors, or the like). Some embodiments can include a device such as a touchscreen that function as both input and output device. In some embodiments, other user output devices 1724 can be provided in addition to or instead of a display. Examples include indicator lights, speakers, tactile "display" devices, printers, and so on.

Some embodiments include electronic components, such as microprocessors, storage and memory that store computer program instructions in a computer readable storage medium. Many of the features described in this specification can be implemented as processes that are specified as a set of program instructions encoded on a computer readable storage medium. When these program instructions are executed by one or more processing units, they cause the processing unit(s) to perform various operation indicated in the program instructions. Examples of program instructions or computer code include machine code, such as is produced by a compiler, and files including higher-level code that are executed by a computer, an electronic component, or a microprocessor using an interpreter. Through suitable programming, processing unit(s) 1704 and 1716 can provide various functionality for server system 1700 and client computing system 1714, including any of the functionality described herein as being performed by a server or client, or other functionality associated with message management services.

It will be appreciated that server system 1700 and client computing system 1714 are illustrative and that variations and modifications are possible. Computer systems used in connection with embodiments of the present invention can have other capabilities not specifically described here. Further, while server system 1700 and client computing system 1714 are described with reference to particular blocks, it is to be understood that these blocks are defined for convenience of description and are not intended to imply a particular physical arrangement of component parts. For instance, different blocks can be but need not be located in the same facility, in the same server rack, or on the same motherboard. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present invention can be realized in a variety of apparatus including electronic devices implemented using any combination of circuitry and software.

While the invention has been described with respect to specific embodiments, one skilled in the art will recognize that numerous modifications are possible. For instance, although specific examples of rules (including triggering conditions and/or resulting actions) and processes for generating suggested rules are described, other rules and processes can be implemented. Embodiments of the invention can be realized using a variety of computer systems and communication technologies including but not limited to specific examples described herein.

Embodiments of the present invention can be realized using any combination of dedicated components and/or programmable processors and/or other programmable devices. The various processes described herein can be implemented on the same processor or different processors in any combination. Where components are described as being configured to perform certain operations, such configuration can be accomplished, e.g., by designing electronic circuits to perform the operation, by programming programmable electronic circuits (such as microprocessors) to perform the operation, or any combination thereof. Further, while the embodiments described above may make reference to specific hardware and software components, those skilled in the art will appreciate that different combinations of hardware and/or software components may also be used and that particular operations described as being implemented in hardware might also be implemented in software or vice versa.

Computer programs incorporating various features of the present invention may be encoded and stored on various computer readable storage media; suitable media include magnetic disk or tape, optical storage media such as compact disk (CD) or DVD (digital versatile disk), flash memory, and other non-transitory media. Computer readable media encoded with the program code may be packaged with a compatible electronic device, or the program code may be provided separately from electronic devices (e.g., via Internet download or as a separately packaged computer-readable storage medium).

Thus, although the invention has been described with respect to specific embodiments, it will be appreciated that the invention is intended to cover all modifications and equivalents within the scope of the following claims.

What is claimed is:

1. A method, comprising:
   identifying, by a content management service, a first content item for a first account of a user and a second content item for a second account of the user;
   for the first content item, generating, by the content management service, a first event record, wherein the first event record comprises a first set of content item features associated with the first content item and first event information indicating a first action taken by the user on the first content item;
   for the second content item, generating, by the content management service, a second event record, wherein the second event record comprises a second set of content item features associated with the second content item and second event information indicating a second action taken by the user on the second content item;
   analyzing, by the content management service, event records corresponding to content items associated with the first account and the second account, the event records comprising the first event record and the second event record;
   detecting, by the content management service, a triggering condition based at least in part on the first set of content item features, the second set of content item features, the first action, and the second action;
   identifying, by the content management service, a new content item to be associated with the first account or the second account;
   determining, by the content management service, that the triggering condition is present in the new content item;
   based on the determining, generating, by the content management service, suggestion metadata defining a suggested rule to automatically perform the first action or the second action on the new content item;
   adding, by the content management service, the suggestion metadata to the new content item; and
   causing, by the content management service, display of the new content item and a prompt to accept the suggested rule to automatically perform the first action or the second action on the new content item and future content items satisfying the triggering condition.

2. The method of claim 1, wherein identifying, at the content management service, the first content item for the first account of the user comprises:
   detecting, via a user interface presenting the first content item, an input gesture corresponding to an archiving action, wherein the archiving action is the first action taken by the user on the first content item.

3. The method of claim 1, wherein identifying, at the content management service, the first content item for the first account of the user comprises:
   detecting, via a user interface presenting the first content item, an input gesture corresponding to a moving action that moves the first content item from a first storage location to a second storage location, wherein the moving action is the first action taken by the user on the first content item.

4. The method of claim 1, wherein identifying, at the content management service, the first content item for the first account of the user comprises:
   detecting, via a user interface presenting the first content item, an input gesture corresponding to a deleting action that deletes the first content item from its storage location, wherein the deleting action is the first action taken by the user on the first content item.

5. The method of claim 1, wherein identifying, at the content management service, the first content item for the first account of the user comprises:
- detecting, via a user interface presenting the first content item, an input gesture corresponding to a sharing action that shares the first content item with another user, wherein the sharing action is the first action taken by the user on the first content item.

6. The method of claim 1, further comprising:
- receiving, by the content management service, a user input accepting the suggested rule;
- generating, by the content management service, a rule corresponding to the suggested rule;
- identifying, by the content management service, a third content item associated with the first account or the second account;
- determining, by the content management service, that the third content item is associated with the rule; and
- based on the determining, applying, by the content management service, the first action or the second action to the third content item.

7. The method of claim 1, wherein analyzing, by the content management service, the event records corresponding to the content items associated with the first account and the second account comprises:
- correlating the first set of content item features with the second set of content item features with the first action and the second action.

8. A non-transitory computer readable medium including one or more sequences of instructions that, when executed by one or more processors, causes a content management service to perform operations comprising:
- accessing, by the content management service, a first content item for a first account of a user and a second content item for a second account of the user;
- for the first content item, generating, by the content management service, a first event record, wherein the first event record comprises a first set of content item features associated with the first content item and first event information indicating a first action taken by the user on the first content item;
- for the second content item, generating, by the content management service, a second event record, wherein the second event record comprises a second set of content item features associated with the second content item and second event information indicating a second action taken by the user on the second content item;
- analyzing, by the content management service, event records corresponding to content items associated with the first account and the second account, the event records comprising the first event record and the second event record;
- detecting, by the content management service, a triggering condition based at least in part on the first set of content item features, the second set of content item features, the first action, and the second action;
- identifying, by the content management service, a new content item to be associated with the first account or the second account;
- determining, by the content management service, that the triggering condition is present in the new content item;
- based on the determining, generating, by the content management service, a suggested rule to automatically perform the first action or the second action on the new content item; and
- causing, by the content management service, display of the new content item and a prompt to accept the suggested rule to automatically perform the first action or the second action on the new content item and future content items satisfying the triggering condition.

9. The non-transitory computer readable medium of claim 8, wherein identifying, at the content management service, the first content item for the first account of the user comprises:
- detecting, via a user interface presenting the first content item, an input gesture corresponding to an archiving action, wherein the archiving action is the first action taken by the user on the first content item.

10. The non-transitory computer readable medium of claim 8, wherein identifying, at the content management service, the first content item for the first account of the user comprises:
- detecting, via a user interface presenting the first content item, an input gesture corresponding to a moving action that moves the first content item from a first storage location to a second storage location, wherein the moving action is the first action taken by the user on the first content item.

11. The non-transitory computer readable medium of claim 8, wherein identifying, at the content management service, the first content item for the first account of the user comprises:
- detecting, via a user interface presenting the first content item, an input gesture corresponding to a deleting action that deletes the first content item from its storage location, wherein the deleting action is the first action taken by the user on the first content item.

12. The non-transitory computer readable medium of claim 8, wherein identifying, at the content management service, the first content item for the first account of the user comprises:
- detecting, via a user interface presenting the first content item, an input gesture corresponding to a sharing action that shares the first content item with another user, wherein the sharing action is the first action taken by the user on the first content item.

13. The non-transitory computer readable medium of claim 8, further comprising:
- receiving, by the content management service, a user input accepting the suggested rule;
- generating, by the content management service, a rule corresponding to the suggested rule;
- identifying, by the content management service, a third content item associated with the first account or the second account;
- determining, by the content management service, that the third content item is associated with the rule; and
- based on the determining, applying, by the content management service, the first action or the second action to the third content item.

14. The non-transitory computer readable medium of claim 8, wherein analyzing, by the content management service, the event records corresponding to the content items associated with the first account and the second account comprises:
- correlating the first set of content item features with the second set of content item features with the first action and the second action.

15. A system comprising:
- one or more processors; and a memory having programming instructions stored thereon, which, when executed by the one or more processors, causes a computing system to perform operations comprising:
  identifying, by a content management service, a first content item for a first account of a user and a second content item for a second account of the user;
  for the first content item, generating, by the content management service, a first event record, wherein the first event record comprises a first set of content item features associated with the first content item and first event information indicating a first action taken by the user on the first content item;
  for the second content item, generating, by the content management service, a second event record, wherein the second event record comprises a second set of content item features associated with the second content item and second event information indicating a second action taken by the user on the second content item;
  analyzing, by the content management service, event records corresponding to content items associated with the first account and the second account, the event records comprising the first event record and the second event record;
  detecting, by the content management service, a triggering condition based at least in part on the first set of content item features, the second set of content item features, the first action, and the second action;
  identifying, by the content management service, a new content item to be associated with the first account or the second account;
  determining, by the content management service, that the triggering condition is present in the new content item;
  based on the determining, generating, by the content management service, suggestion metadata defining a suggested rule to automatically perform the first action or the second action on the new content item;
  adding, by the content management service, the suggestion metadata to the new content item; and
  causing, by the content management service, display of the new content item and a prompt to accept the suggested rule to automatically perform the first action or the second action on the new content item and future content items satisfying the triggering condition.

16. The system of claim 15, wherein identifying, at the content management service, the first content item for the first account of the user comprises:
  detecting, via a user interface presenting the first content item, an input gesture corresponding to an archiving action, wherein the archiving action is the first action taken by the user on the first content item.

17. The system of claim 15, wherein identifying, at the content management service, the first content item for the first account of the user comprises:
  detecting, via a user interface presenting the first content item, an input gesture corresponding to a moving action that moves the first content item from a first storage location to a second storage location, wherein the moving action is the first action taken by the user on the first content item.

18. The system of claim 15, wherein identifying, at the content management service, the first content item for the first account of the user comprises:
  detecting, via a user interface presenting the first content item, an input gesture corresponding to a deleting action that deletes the first content item from its storage location, wherein the deleting action is the first action taken by the user on the first content item.

19. The system of claim 15, wherein identifying, at the content management service, the first content item for the first account of the user comprises:
  detecting, via a user interface presenting the first content item, an input gesture corresponding to a sharing action that shares the first content item with another user, wherein the sharing action is the first action taken by the user on the first content item.

20. The system of claim 15, wherein the operations further comprise:
  receiving, by the content management service, a user input accepting the suggested rule;
  generating, by the content management service, a rule corresponding to the suggested rule;
  identifying, by the content management service, a third content item associated with the first account or the second account;
  determining, by the content management service, that the third content item is associated with the rule; and
  based on the determining, applying, by the content management service, the first action or the second action to the third content item.

* * * * *